US010755026B1

(12) United States Patent
Luo

(10) Patent No.: US 10,755,026 B1
(45) Date of Patent: Aug. 25, 2020

(54) CIRCUIT DESIGN INCLUDING DESIGN RULE VIOLATION CORRECTION UTILIZING PATCHES BASED ON DEEP REINFORCEMENT LEARNING

(71) Applicant: Synopsys, Inc., Mountain View, CA (US)

(72) Inventor: Jianfeng Luo, Foster City, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/179,342

(22) Filed: Nov. 2, 2018

Related U.S. Application Data

(60) Provisional application No. 62/585,775, filed on Nov. 14, 2017.

(51) Int. Cl.
*G06F 30/00* (2020.01)
*G06F 30/398* (2020.01)
*G06N 20/20* (2019.01)
*G06F 30/327* (2020.01)

(52) U.S. Cl.
CPC .......... *G06F 30/398* (2020.01); *G06F 30/327* (2020.01); *G06N 20/20* (2019.01)

(58) Field of Classification Search
CPC .................................................. G06F 30/398
USPC ........................................................ 716/112
See application file for complete search history.

(56) References Cited

U.S. PATENT DOCUMENTS

| | | | | |
|---|---|---|---|---|
| 2010/0305933 | A1* | 12/2010 | Chang | G06F 30/331 703/15 |
| 2011/0289472 | A1* | 11/2011 | Finkler | G06F 17/5068 716/136 |
| 2016/0378902 | A1* | 12/2016 | Graur | G06F 30/39 716/52 |
| 2017/0076116 | A1* | 3/2017 | Chen | G06N 20/00 |
| 2019/0065630 | A1* | 2/2019 | Kim | H01L 29/66795 |
| 2019/0067060 | A1* | 2/2019 | Plihal | G06T 7/001 |
| 2019/0370432 | A1* | 12/2019 | Sha | G06F 17/5072 |
| 2020/0104457 | A1* | 4/2020 | Chuang | G06F 30/392 |

OTHER PUBLICATIONS

Juliani, Arthur, "Simple Reinforcement Learning with Tensor6ow Part 0: Q-Learning with Tables and Neural Networks," published on Medium, Aug. 25, 2016. downloaded from on (7 pages).
Li, Yuxi, Deep reinforcement learning: an overview. Nov. 28, 2018. arXiv:1701.07274v6 (85 pages).

(Continued)

*Primary Examiner* — Suchin Parihar
(74) *Attorney, Agent, or Firm* — HIPLegal LLP; Judith Szepesi

(57) ABSTRACT

A method of improving a design rule fixing process comprises receiving an integrated circuit design, including layout elements, and identifying a plurality of design rule violations in the integrated circuit design. The process then identifies a plurality of possible actions, each action comprising fixing a design rule. The process then uses a deep learning algorithm to select an action, the action representing fixing of a particular design rule violation. The process then comprises applying a first patch, based on the order returning to step (b) to select a next patch to apply.

20 Claims, 22 Drawing Sheets

(56) References Cited

OTHER PUBLICATIONS

Mnih, Volodymyr, et al., "Playing Atari with deep reinforcement learning," NIPS Deep Learning Workshop 2013. Downloaded from (9 pages).

Silver, D. et al., "Deterministic policy gradient algorithms,"Proceedings of the 31th International Conference on Machine Learning, Beijing, 2014. (9 pages).

Silver, David, et al., "Mastering the game of Go with deep neural networks and tree search," Nature, vol. 529, Jan. 28, 2016. (20 pages).

Sutton, Richard S. and Barto, Andrew G., Reinforcement Learning: An Introduction., Nov. 5, 2017.

\* cited by examiner

```
reward: 5.0 predicted: [[ 12.4916203]]
reward: -8.0 predicted: [[ 12.1616631]]
reward: 6.0 predicted: [[ 24.3527955]]
reward: 1.0 predicted: [[ 24.4860631]]
reward: -1.0 predicted: [[ 23.8910753]]
reward: 73.0 predicted: [[ 12.3174200]]
reward: 931.0 predicted: [[ 790.4827809]]
reward: -8.0 predicted: [[ 121.0365295]]
reward: -5.0 predicted: [[ 111.8152008]]
reward: 32.0 predicted: [[ 113.1528091]]
reward: 8.0 predicted: [[ 106.8492660]]
reward: 2.0 predicted: [[ 99.0971456]]
reward: 1.0 predicted: [[ 103.2286987]]
```

FIG. 11

| Partition | # vios by heuristic | # vios by random | # vios by model |
|---|---|---|---|
| 1/30 | 220 | 382 | 212 |
| 2/30 | 260 | 458 | 228 |
| 3/30 | 260 | 439 | 224 |
| 4/30 | 278 | 460 | 200 |
| 5/30 | 181 | 383 | 145 |
| 6/30 | 181 | 383 | 145 |
| 7/30 | 274 | 471 | 234 |
| 8/30 | 234 | 443 | 221 |
| 9/30 | 233 | 443 | 220 |
| 10/30 | 233 | 443 | 220 |
| 11/30 | 236 | 476 | 254 |
| 12/30 | 184 | 426 | 196 |
| 13/30 | 184 | 426 | 196 |
| 14/30 | 184 | 426 | 196 |
| 15/30 | 184 | 426 | 196 |
| 16/30 | 210 | 436 | 211 |
| 17/30 | 190 | 419 | 170 |
| 18/30 | 189 | 418 | 169 |
| 19/30 | 189 | 418 | 169 |
| 20/30 | 189 | 418 | 169 |
| 21/30 | 150 | 381 | 147 |
| 22/30 | 150 | 381 | 147 |
| 23/30 | 150 | 381 | 147 |
| 24/30 | 150 | 381 | 147 |
| 25/30 | 150 | 381 | 147 |
| 26/30 | 150 | 381 | 147 |
| 27/30 | 150 | 381 | 147 |
| 28/30 | 150 | 381 | 147 |
| 29/30 | 150 | 381 | 147 |
| 30/30 | 150 | 381 | 147 |

FIG. 13

| Partition | # vios by heuristic | # vios by random | # vios by model |
|---|---|---|---|
| 1/6882 | 12 | 12 | 12 |
| 34/6882 | 381 | 769 | 415 |
| 68/6882 | 689 | 1530 | 768 |
| 102/6882 | 1530 | 3365 | 1696 |
| 136/6882 | 1843 | 4176 | 2012 |
| 170/6882 | 2862 | 6018 | 3050 |
| 204/6882 | 3477 | 6803 | 3542 |
| 238/6882 | 4268 | 8310 | 4413 |
| 272/6882 | 4979 | 9298 | 5158 |
| 306/6882 | 5801 | 10569 | 6074 |
| 340/6882 | 6669 | 11617 | 6843 |
| 374/6882 | 7212 | 12812 | 7516 |
| 408/6882 | 7727 | 13772 | 7826 |
| 442/6882 | 8560 | 15169 | 8897 |
| 476/6882 | 9252 | 16291 | 9316 |
| 510/6882 | 9617 | 17422 | 9796 |
| 544/6882 | 9925 | 18440 | 10231 |
| 578/6882 | 10187 | 19462 | 10688 |
| 612/6882 | 10578 | 20515 | 11068 |
| 646/6882 | 11002 | 21348 | 11394 |
| 680/6882 | 11553 | 22536 | 12031 |
| 714/6882 | 11781 | 23264 | 12234 |
| 748/6882 | 12049 | 23971 | 12534 |
| 782/6882 | 12432 | 24617 | 12861 |
| 816/6882 | 12826 | 25789 | 13424 |
| 850/6882 | 13007 | 26855 | 13588 |
| 884/6882 | 13396 | 27805 | 13915 |
| 918/6882 | 13482 | 28313 | 14114 |
| 952/6882 | 13870 | 28958 | 14442 |

FIG. 14

| First test case | | | Second test case | | |
|---|---|---|---|---|---|
| Partition | 2D | 3D | Partition | 2D | 3D |
| 1/30 | 227 | 212 | 1/6882 | 12 | 12 |
| 2/30 | 216 | 228 | 34/6882 | 426 | 415 |
| 3/30 | 215 | 224 | 68/6882 | 754 | 768 |
| 4/30 | 270 | 200 | 102/6882 | 1596 | 1696 |
| 5/30 | 205 | 145 | 136/6882 | 1991 | 2012 |
| 6/30 | 205 | 145 | 170/6882 | 3205 | 3050 |
| 7/30 | 284 | 234 | 204/6882 | 3703 | 3542 |
| 8/30 | 232 | 221 | 238/6882 | 4539 | 4413 |
| 9/30 | 232 | 220 | 272/6882 | 5226 | 5158 |
| 10/30 | 232 | 220 | 306/6882 | 6121 | 6074 |
| 11/30 | 255 | 254 | 340/6882 | 6934 | 6843 |
| 12/30 | 212 | 196 | 374/6882 | 7660 | 7516 |
| 13/30 | 212 | 196 | 408/6882 | 7919 | 7826 |
| 14/30 | 212 | 196 | 442/6882 | 8812 | 8897 |
| 15/30 | 212 | 196 | 476/6882 | 9495 | 9316 |

CIRCUIT DESIGN INCLUDING DESIGN RULE VIOLATION CORRECTION UTILIZING PATCHES BASED ON DEEP REINFORCEMENT LEARNING

RELATED APPLICATION

The present application claims priority to U.S. Provisional Application No. 62/585,775, filed on Nov. 14, 2018, and incorporates that application in its entirety.

FIELD

The present invention relates to circuit design, and more particularly to an improvement in correcting design violation rules

BACKGROUND

In integrated circuit design, during detail routing, design rule checking (DRC) is applied to check if there is any violation under different design rules. Design rules specify geometric and connectivity restrictions to enable manufacturing, accounting variability in semiconductor manufacturing processes. If there are violations, the system will try to fix them. The easiest way to do this is patching, by adding additional metal at the place where violation occurs.

In the prior art, the order of violations to be patched is predefined by heuristic method. These violations are sorted according to the design rules that they violate. The program tries to fix these violations one by one. However, some additional violations may be generated while patching one. As a result, this procedure repeats until all the violations have been fixed by patching.

FIG. 1 briefly shows how a prior art patching process works. First, the violation list is sorted. Then the process starts at the very beginning of the list, and patches through the whole list. Often, one or more violations are generated during the patching process, and they will be sorted based on the same order and processed at next iteration. The number of iterations to finish patching until there are no violations can vary. Note that after patching through all depths of violations, rip-up reroute will be applied. Thus, the effect of rip-up reroute will be taken into consideration.

Some violations cannot be resolved by simply patching or applying rip-up reroute. Therefore, these violations will remain in the design. By observation, the number of violations which remain after patching varies, and it is highly correlated to the order of rules to sort the violation list.

BRIEF DESCRIPTION OF THE FIGURES

The present invention is illustrated by way of example, and not by way of limitation, in the figures of the accompanying drawings and in which like reference numerals refer to similar elements and in which:

FIG. 11 shows an exemplary set of results of predictions after training.

FIG. 13 illustrates a table which shows the results of running first test case at iteration 0.

FIG. 14 shows the results of the second test case.

FIG. 17 shows the results of the performance for two test cases applying the 2-dimensional and 3-dimensional models respectively.

FIG. 18 shows a calculated action probability.

DETAILED DESCRIPTION

The present application utilizes a methodology to apply deep reinforcement learning to optimize the decision making in the fixing of design rule violations aspect of integrated circuit design. In design rule checking, one solution to fix design rule violations is to apply a patch. The present application uses deep reinforcement learning help to make routing decisions in an integrated circuit design system. Although one approach to deep reinforcement learning is described in detail in this application, one of skill in the art would understand that other machine learning techniques can be applied when they fit the framework proposed without departing from the scope of the invention. Additionally, the deep reinforcement learning techniques discussed may be applied to other aspects of integrated circuit design, such as re-clocking.

The following detailed description of embodiments makes reference to the accompanying drawings in which like references indicate similar elements, showing by way of illustration specific embodiments of practicing the process. Description of these embodiments is in sufficient detail to enable those skilled in the art to practice the invention. One skilled in the art understands that other embodiments may be utilized and that logical, mechanical, electrical, functional and other changes may be made without departing from the scope of the present disclosure. The following detailed description is, therefore, not to be taken in a limiting sense, and the scope of the present invention is defined only by the appended claims.

Introduction to Reinforcement Learning

Reinforcement Learning is a type of Machine Learning which allows software agents to automatically determine the ideal behavior within a specific context to maximize the performance. Since it is neither supervised nor unsupervised learning, simple feedback (reward) is required for the agent to learn its behavior. In such model, no correct answers are provided, so the agent learns the best policy by trial and error.

Figure 2:
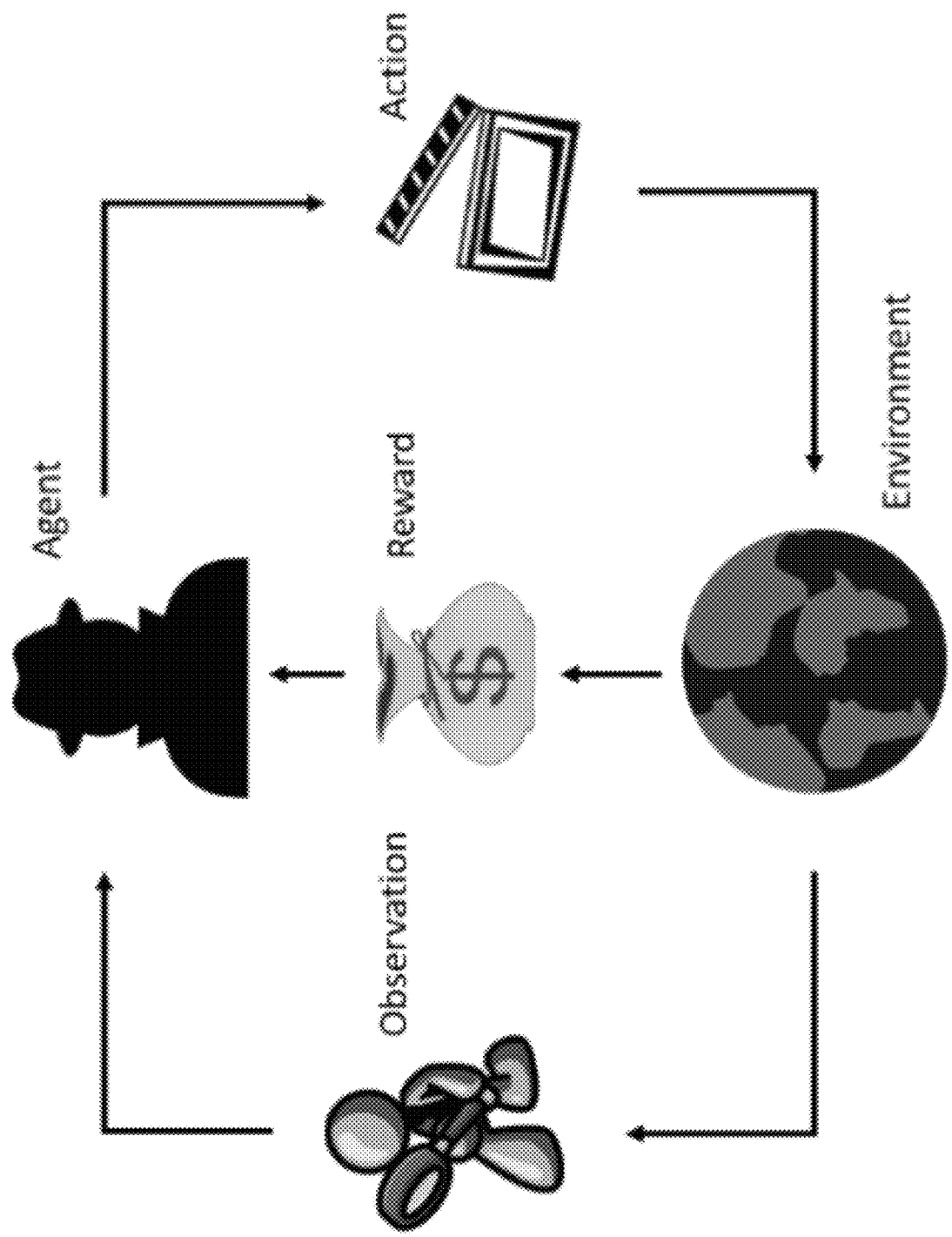
FIG. 2 illustrates one embodiment of how a reinforcement learning framework works.

FIG. 2 illustrates how a reinforcement learning framework works. The observations represent states which an agent can see. Based on those states, the agent makes a decision on what action to take. After an action is taken, the state changes. The environment also gives feedback (a.k.a. reward) to the agent based on the chosen action, so that the agent can evaluate how good the previous action is. Meanwhile, the agent gets a new state by observation, allowing it to decide the next action to take.

In machine learning, convolutional neural networks are widely used in computer vision to analyze images. Some of the common terms used in convolutional neural networks are defined as follows:

Filter. The filter is used to extract the features inside a window. This window will go through the input image, calculating the features of each part. Unlike fully connected network, all inputs share the same weights inside the filter, thus it reduces the complexity of the network significantly.

Figure 3:
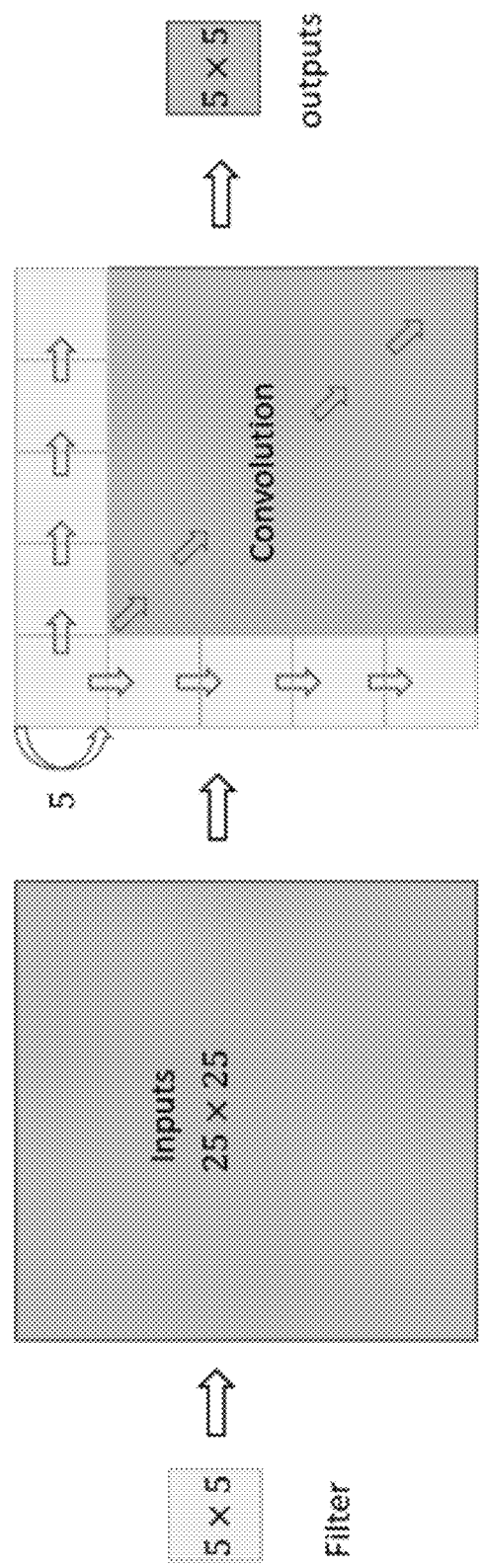
FIG. 3 is a diagram providing an illustration of how convolution works.

Strides. The strides define how far the filter moves at each step. For example, if an input size 25×25 and filter size 5×5 is used, then the system will calculate a value for every 25 digits, and move 5 digits per convolution. Consequently, the output size will be 5×5. FIG. 3 briefly shows how convolution works. As can be seen, the larger the strides are, the smaller the outputs will be. However, if the strides are too large, some information of the inputs might be lost.

Padding. When the input size is not divisible by the filter size, padding will be applied, which typically adds zeros around the inputs.

Channel. Every channel contains its own filter.

Applying Reinforcement Learning to Patch Ordering.

Figure 1:
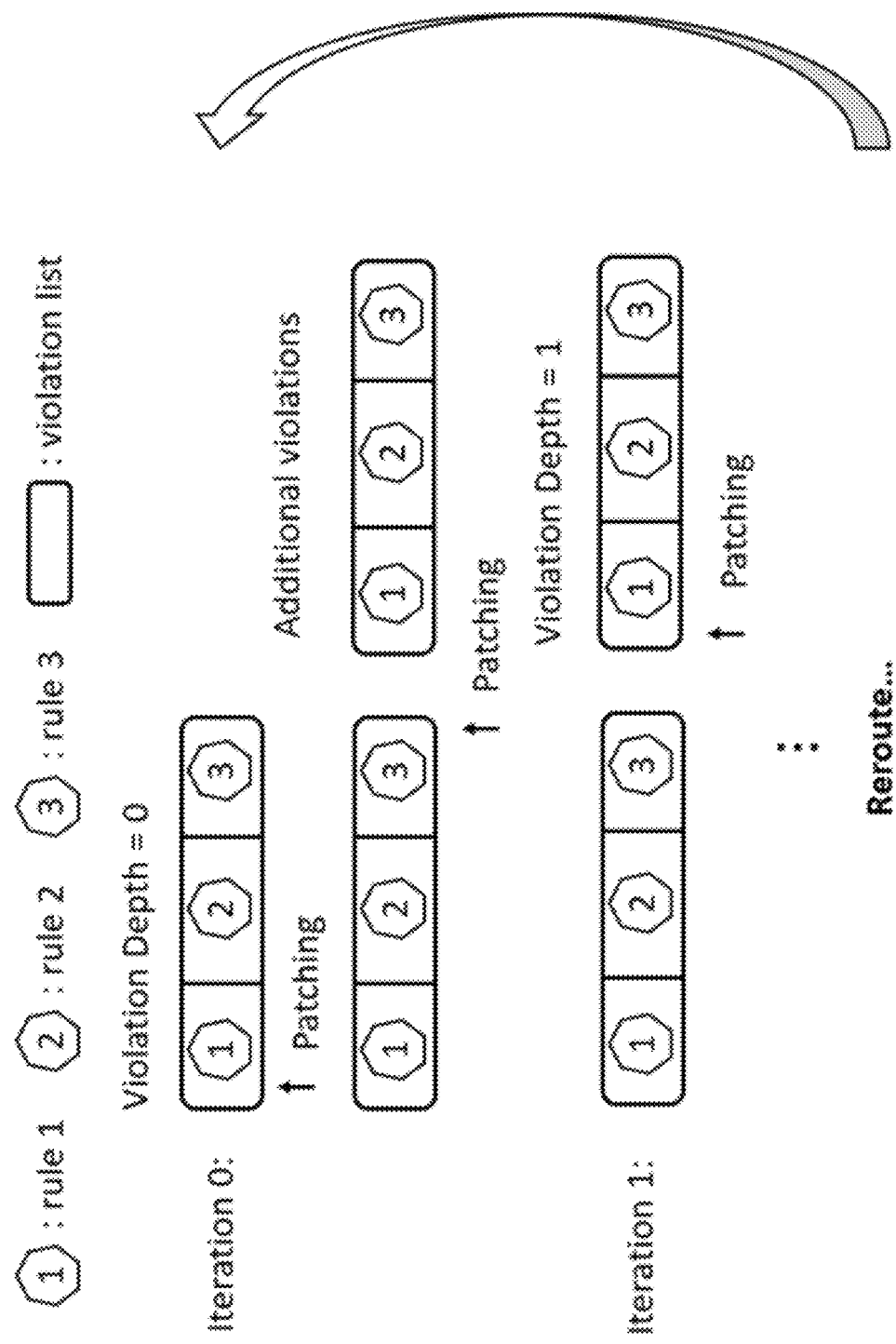
FIG. 1 is an illustration of a prior art patching process.

Using a traditional patching process, as shown in FIG. 1, some violations may not be eliminated by the patching. By selecting the order that the violations are addressed, the number of violations that are not eliminated can be minimized. As noted above, the prior art uses the same order for patching each time. In contrast, the present process uses smart ordering to minimize the final number of violations.

In one embodiment, an agent consists of two parts: (1) policy gradient model, and (2) value gradient model. The policy gradient model is used to decide which action to take, while the value gradient model provides a baseline for the policy model to evaluate the quality of the policy.

Figure 20:
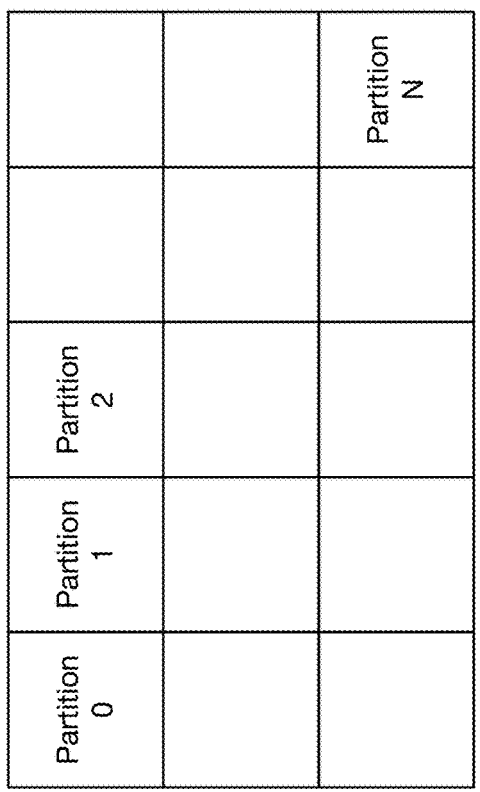
FIG. 20 is a block diagram of one embodiment of design rule violation fixing using patches.
Figure 20:
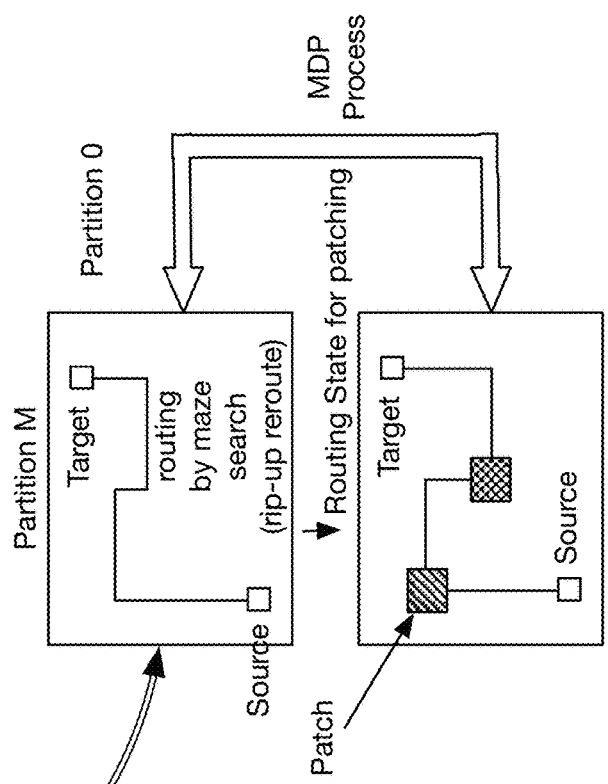

FIG. 20 illustrates one embodiment of the overall process of routing, and addressing design rule violations using patching.

Initially, the system partitions the integrated circuit (or chip) into a plurality of partitions.

Within each partition, the system performs routing. In one embodiment, the routing of multiple partitions may be done in parallel.

For each partition, a maze search is done for routing, involving rip-up reroute, and connection to connect each net from a source to a target. The process of such routing is known in the art.

After the maze search, the process determines whether there are design rule violations, and if so, the system patches those design rule violations. As will be discussed in more detail below, selecting which design rule violation to address next utilizes the deep reinforcement learning system.

After a patch is applied, the process returns to do a new maze search involving the rip-up and reroute, and again evaluates the design rule violations. This process is repeated until the number of open design rule violations is below a threshold.

This process may be performed in parallel for a plurality of partitions of a chip. In one embodiment, it may also be performed for the chip as a whole, or larger partitions. The process described below is focused on the selection of the patch for fixing.

In the region where the system is set to optimize patch selection, the state is represented as a three-dimensional array, which has the size (layerCnt, STATE_X_SIZE, STATE_Y_SIZE). In one embodiment, the system can restrict the size of the array. In one embodiment, the first 8 layers are considered, as they have the most significant influence on the result. The state is then an 8×STATE_X_SIZE×STATE_Y_SIZE matrix. In one embodiment the State X and State Y variables may be set to a value that provides sufficient size for the matrix. In one embodiment, and the second and third dimensions are set to 100. No matter how large the region is, it will be divided into a number of cells per layer and mapped into one of the elements in the state matrix. In one embodiment, the region is divided into 10,000 cells per layer. This number may be larger or smaller, and is restricted by the processing power and memory available.

Figure 4:
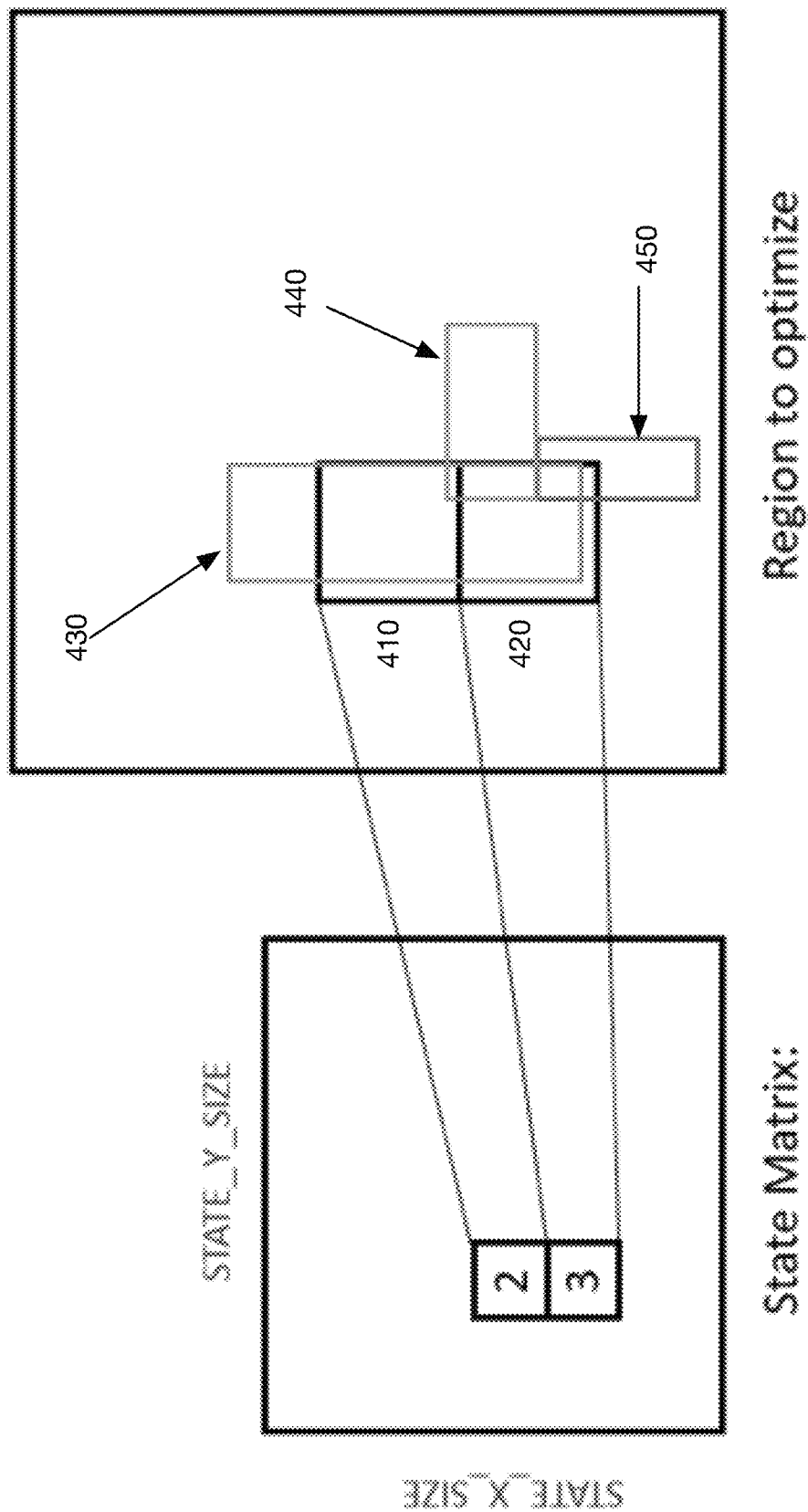
FIG. 4 illustrates one embodiment of two partitions, and shapes that pass through the partitions.

The value of an element in the matrix is equal to the number of shapes passing through the corresponding cell in the region. For example, in FIG. 4, there are two shapes 430, 440 that overlap with the upper cell 410, so the value of the corresponding element in the state matrix will be 2. Similarly, the value of the element associated with the lower cell 420 will be 3, as three shapes 430, 440, 450 pass through that region.

Optimization is based on maximizing a "reward." Generally, the reward is the number of violations reduced by a particular action. For example, if there are 5 violations eliminated and 2 additional violations generated when a certain action is taken, the reward for such action is 3 (total reduction in the number of violations). Consequently, the reward could be a negative number as well.

In one embodiment, the whole patching process, shown in FIG. 1, is referred to as an "episode." Each episode consists of several actions. By summing up the reward of each of the actions in an episode, the total number of active violations which remain in the list is obtained. Minimizing this number is the objective.

In one embodiment, the policy gradient model is a neural network which takes the state as an input, and outputs a distribution. This distribution indicates the probability of an action being the best action in a given state. As noted, the best action is the one with the highest reward, e.g. the largest reduction in the number of design rule violations. In other words, actions are selected from a distribution parameterized by the policy model. By using such stochastic model, the policy gradient integrates over both state and action spaces, whereas the deterministic one only integrates over the state space.

In one embodiment, the value gradient model is a neural network which takes the state as an input, and outputs an expectation of total reward from this state under current policy.

The routing process, in one embodiment, has a Markov property, which means that the next state only depends on the current state, independent of the previous states. As a result, the value gradient model estimates the total future reward by considering only the current state. By doing this, the value gradient model offers a baseline for the policy gradient model to evaluate the quality of the policy. For example, after an episode (full patching process), the reward of each step is known. Thus, the total reward after taking action 0 is equal to $\Sigma_{i=0}^{n} reward_i$. The value gradient model shows that the average total reward for an action which starts from state 0 is equal to $Er[a_0]$. Therefore, the advantage of taking action 0 equals to:

$$advantage_0 = \sum_{i=0}^{n} reward_i - Er[a_0]$$

This number represents how much better this action is compared to the average expected reward. If this number is positive, it means the action is a better than average move.

In one embodiment, an additional discount variable r is added to the actual reward. This discount variable is used to decide the importance of the future rewards as compared to the present reward. The discount factor will be $r^i$ for reward at time step i away from current time. Consequently, the advantage will be defined as follows:

$$advantage_0 = \sum_{i=0}^{n} r^i \times reward_i - Er[a_0]$$

Figure 5:
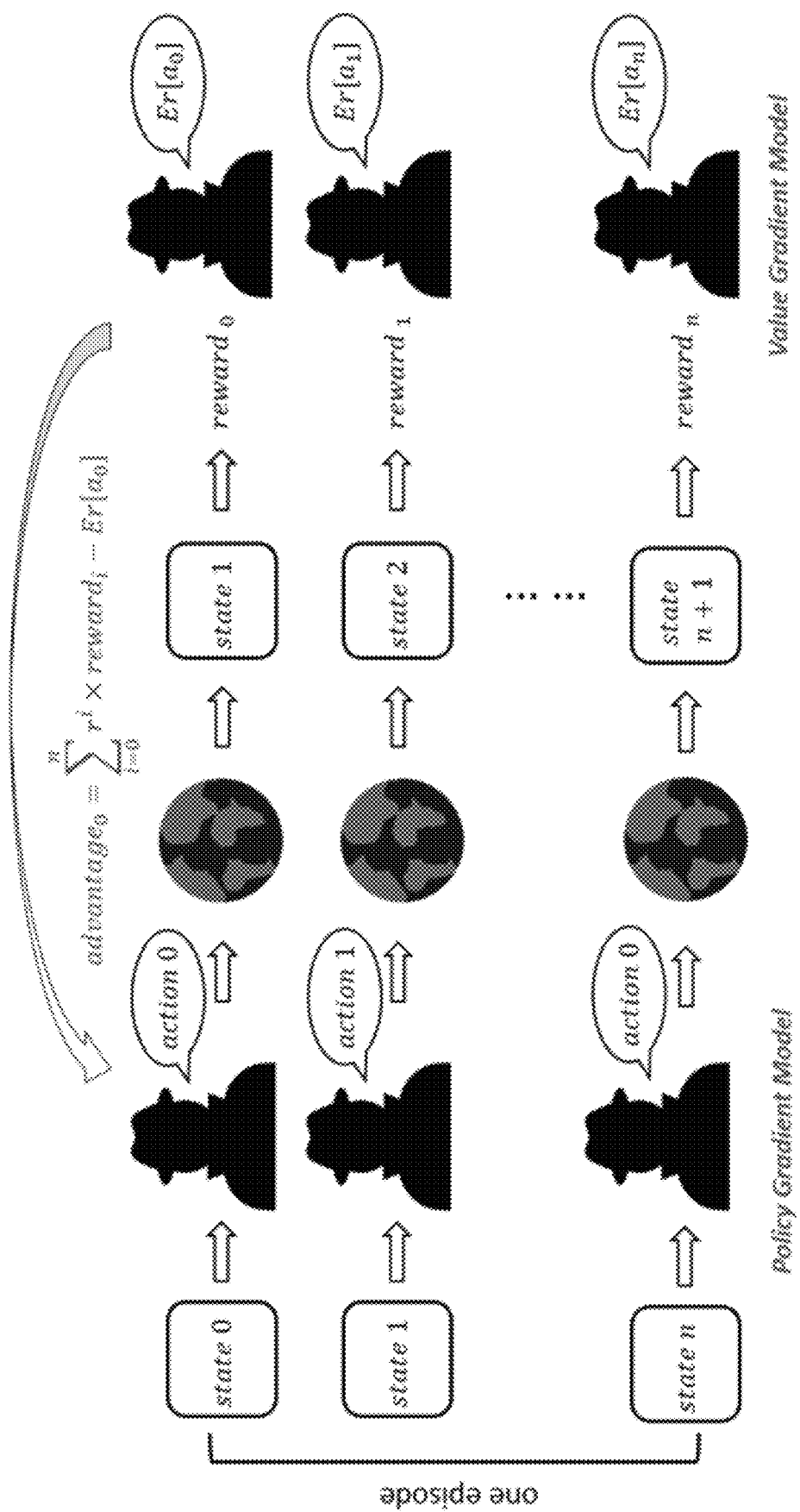
FIG. 5 illustrates one embodiment of how the value gradient model interacts with the policy gradient model.

FIG. 5 illustrates one embodiment of how the value gradient model interacts with the policy gradient model. In one embodiment, the value gradient model is trained with hundreds of episodes before training the policy gradient model. This prevents the value gradient model from offering a useless baseline, making the policy gradient model misjudge how good a certain action is. As shown in FIG. 5, the episode consists of a plurality of actions, taken from state 0 to state n. An action changes the global status by removing (and sometimes adding) design rule violations. The result of each action is a change to the next subsequent state (e.g. from state 0 to state 1) and a reward, e.g. the actual reduction in the number of violations. As noted above, the reward may be negative, if the overall effect of a particular action is to add more violations than it removes.

In this way, using the interplay between the policy gradient model and the value gradient model, the system can determine the effect of each action from each state.

Implementation of the Model

In one embodiment, an action defines the first rule to sort the violations for patching. For simplicity, in one embodiment, the rest of the rules are assigned the same priority which is lower than the priority of the chosen first rule. The possible number of actions equal the number of rules that may be used. In one embodiment, there are 9 rules to choose from and thus the possible number of actions is 9.

Figure 6:
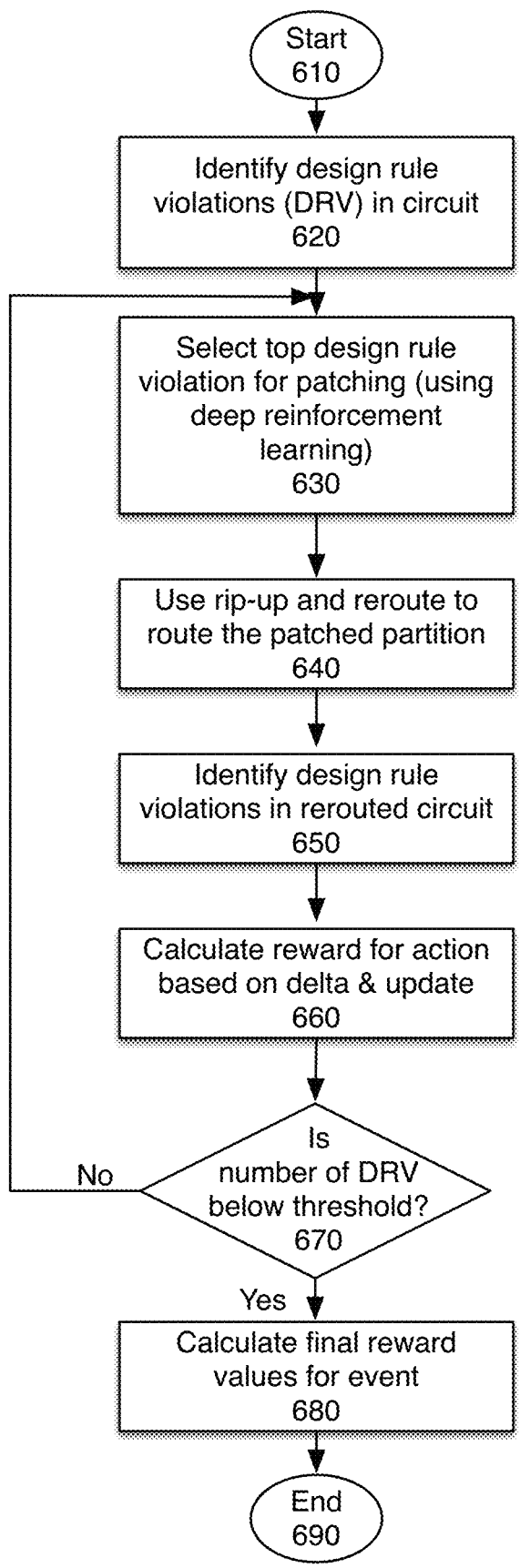
FIG. 6 illustrates one embodiment of the behavior of an action.

FIG. 6 is a flowchart of one embodiment of the behavior of an action.

The process starts at block 610. In one embodiment, this process starts after both the policy gradient model and the value gradient model have initially been trained.

At block 620, a plurality of design rule violations are identified in a circuit that is initially routed.

At block 630, the agent which includes the policy gradient model and the value gradient model, selects the top design rule violation to patch. In one embodiment, the process analyzes the design rule violations based on a current state, and selects the action/patch which has the highest reward.

At block 640, the process utilizes rip-up and reroute to route the newly patched partition.

At block 650, a plurality of design rule violations are identified in the patched circuit. In one embodiment, at block 660, the difference between the count of design rule violations at this stage, and the prior count, is used to calculate the reward for the selected action. In one embodiment, after each iteration this data is updated.

At block 670, the process determines whether the number of design rule violations left is below a threshold. If so, at block 680, the rewards are updated for the actions selected in this event. The process ends at block 690. Otherwise, the process returns to block 630, to allow the agent to select which design rule violation to patch. This process iteratively routes, patches, and reroutes to reduce the number of design rule violations below the threshold.

In addition to episode and reward, previously defined, the system in one embodiment also takes into account the advantage. The advantage is the difference between the immediate reward and the expected immediate reward. This is the special case when setting the discounted rate zero.

As noted above the state is a 3-dimensional matrix, with the first dimension being the layer (in one embodiment 8 layers) and the other two dimensions set to a number whose multiple accounts for the number of cells. Thus for 10,000 cells the second and third dimensions are 100×100, which is equal to 10,000. For a system with 1,000,000 cells, the second and third dimensions would be 1000×1000. Although the dimensions may be kept the same, in one embodiment, they may be different. For example, for 100,000 cells, the dimensions may be 400×250.

As noted above, a policy model predicts the probability of an action having the highest immediate reward, while the value model calculates the expected reward for a given state and policy.

Convolutional Neural Network

As discussed above, in one embodiment, the state is obtained by calculating the number of shapes overlapping in each cell. That is, the state looks like an image representing the density of each portion of the partition. This is similar to a congestion map. Consequently, this property can be utilized by applying convolution for feature extraction. By doing this, the system can reduce memory use for weights and biases, and build a deeper network with acceptable runtime.

Figure 7:
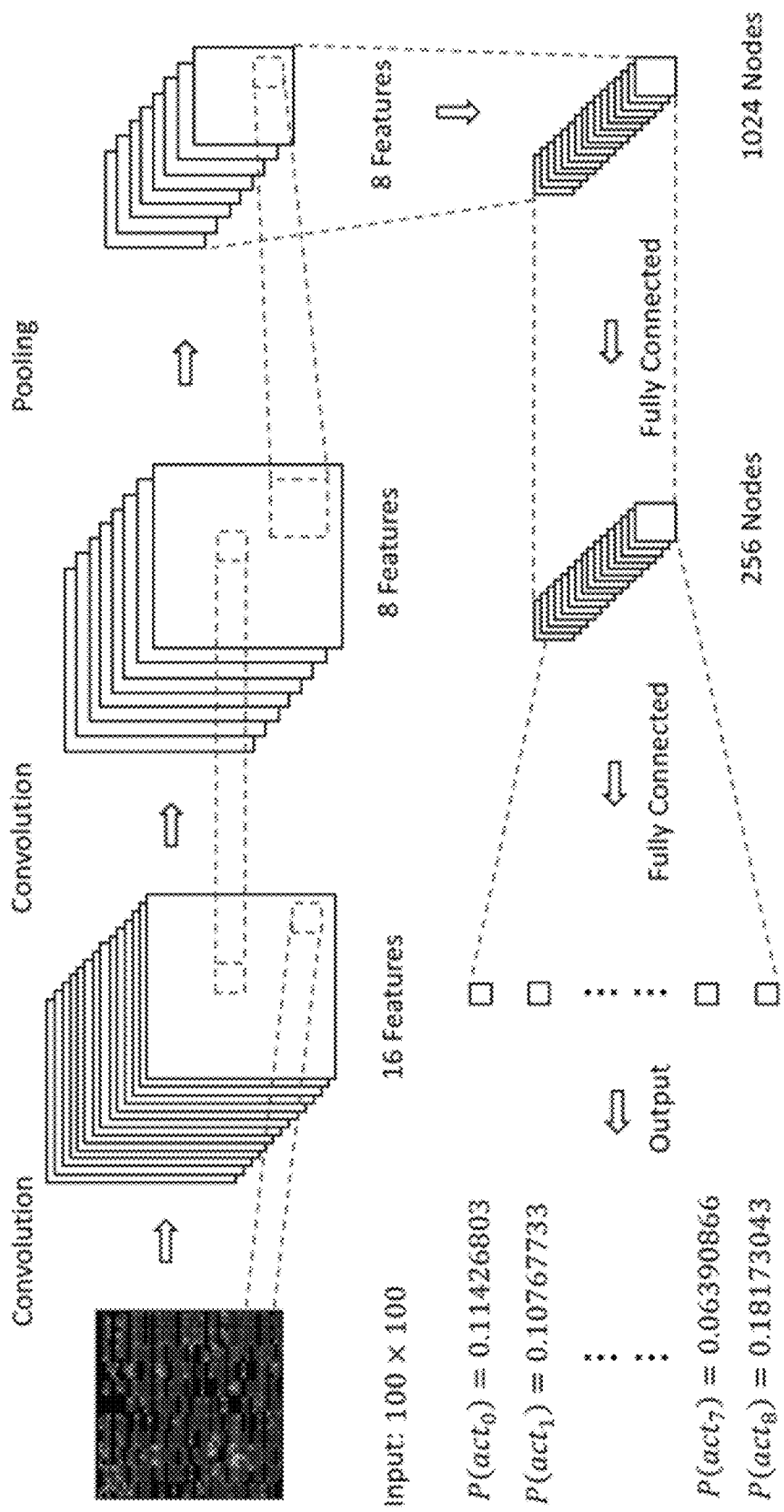
FIG. 7 shows one embodiment of a structure of a network of last two dimensions.

FIG. 7 shows one embodiment of a structure of a network. From a starting point of one state, in one embodiment it will be first transformed to 16 features with the same size, and converted to 8 features by another convolution. In one embodiment, the number of features may be larger or smaller. Then, in one embodiment, max pooling is applied to the neural nodes in previous layers. In one embodiment, max pooling down-samples by dividing the input into rectangular pooling regions, and computing the maximum of each region.

Lastly, in one embodiment, two fully connected layers are applied.

Since one layer is not enough to represent the state of a partition, eight layers are applied in one embodiment. For this exemplary configuration, with 10,000 cells per layer, the input will be a 3-dimensional matrix, which in one embodiment has the size: (layers,X_SIZE,Y_SIZE)=(8,100,100). It's well known, and intuitively clear, that the geometric relationship between close shapes is a big factor in causing violations. As a result, the system does not need a large window to extract the features. In one embodiment, the filter size is defined as (1,10,10). Recall that a filter is used to extract the features inside the window. In one embodiment, the size of the strides will be (1,1,1), which makes the filter move one unit per convolution. Finally, in one embodiment the max pooling is applied along the dimension of the layer. To extract 16 features from the input, one embodiment of the output of layer 1 is shown in FIG. 8.

Figure 8:
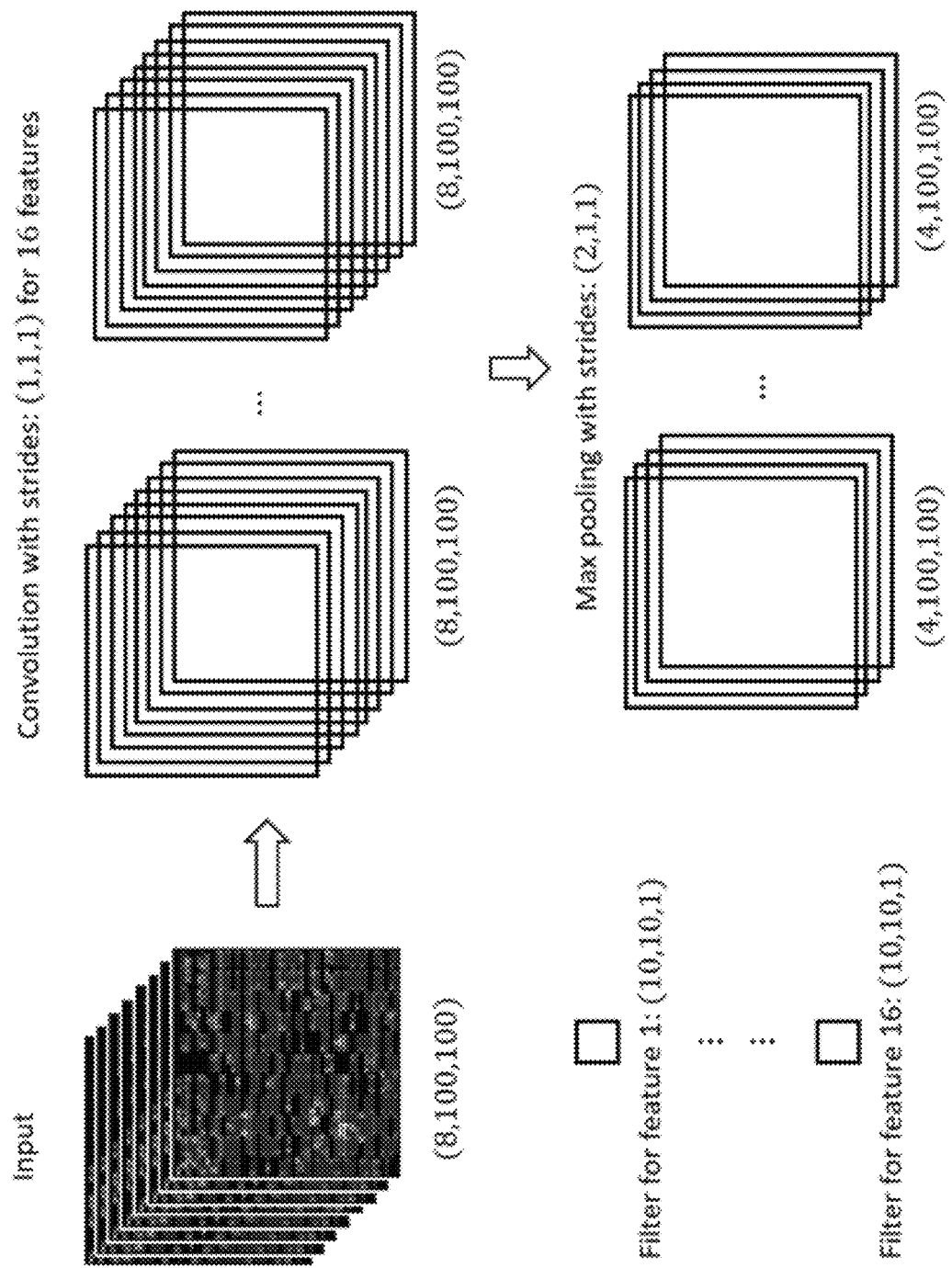
FIG. 8 illustrates one embodiment of the output of layer 1.

As shown in FIG. 8, one filter corresponds to a feature. The 16 filters introduce only 16×10×10 weights and 16 bias. The system can save a lot of weights by applying a convolutional layer. In one embodiment, the strides of the max pooling is (2,1,1), as the dimension of the layer is less important than others. Thus in one embodiment, the system combines two layers into one, which makes the output of one feature become (4,100,100). Since 16 features are used, the output of layer one will be (4,100,100,16).

The second convolutional layer is similar to the first one. However, if the first layer calculates 16 features of the input, there will be 16 channels or features in the input of layer 2. Each channel stores the values of the specific feature calculated by corresponding filter. For example, there could be red, green and blue channels when processing image recognition. In one embodiment, the system uses 16 channels. The number of channels may be changed based on the complexity of the layout.

Figure 9:
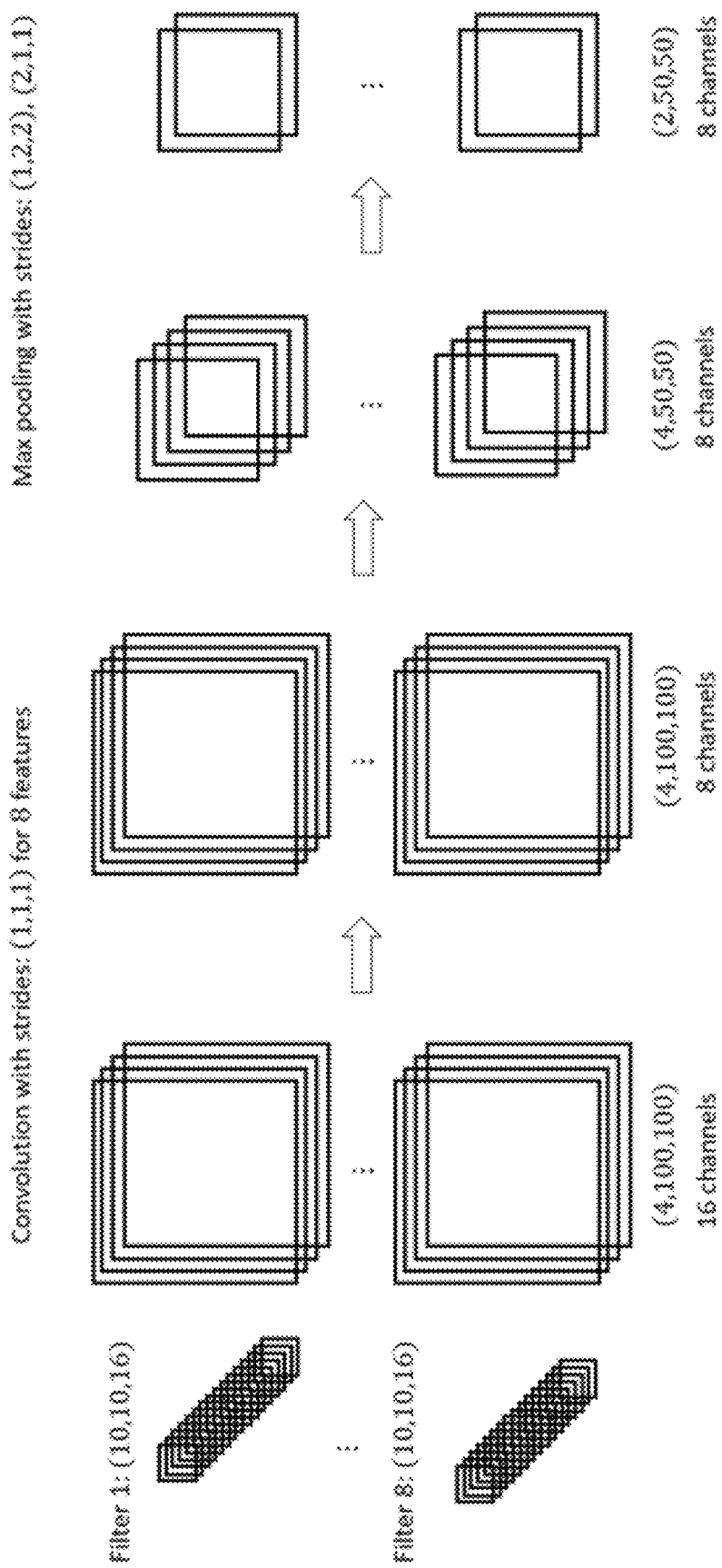
FIG. 9 illustrates one embodiment of the second convolutional layer.

FIG. 9 shows the structure of the second convolutional layer. In one embodiment, the size of the filter is (10,10,16), as there are 16 channels contained in the input provided by layer 1. In addition, in one embodiment, there are 8 filters resulting in 8 channels after the convolution. Then, in one embodiment max pooling with strides (1,2,2) is applied to reduce the size of data, which becomes (4,100/2,100/2)=(4, 50,50). Last, in one embodiment, max pooling along the layer dimension is applied, making the size of the output (2,50,50).

Figure 10:
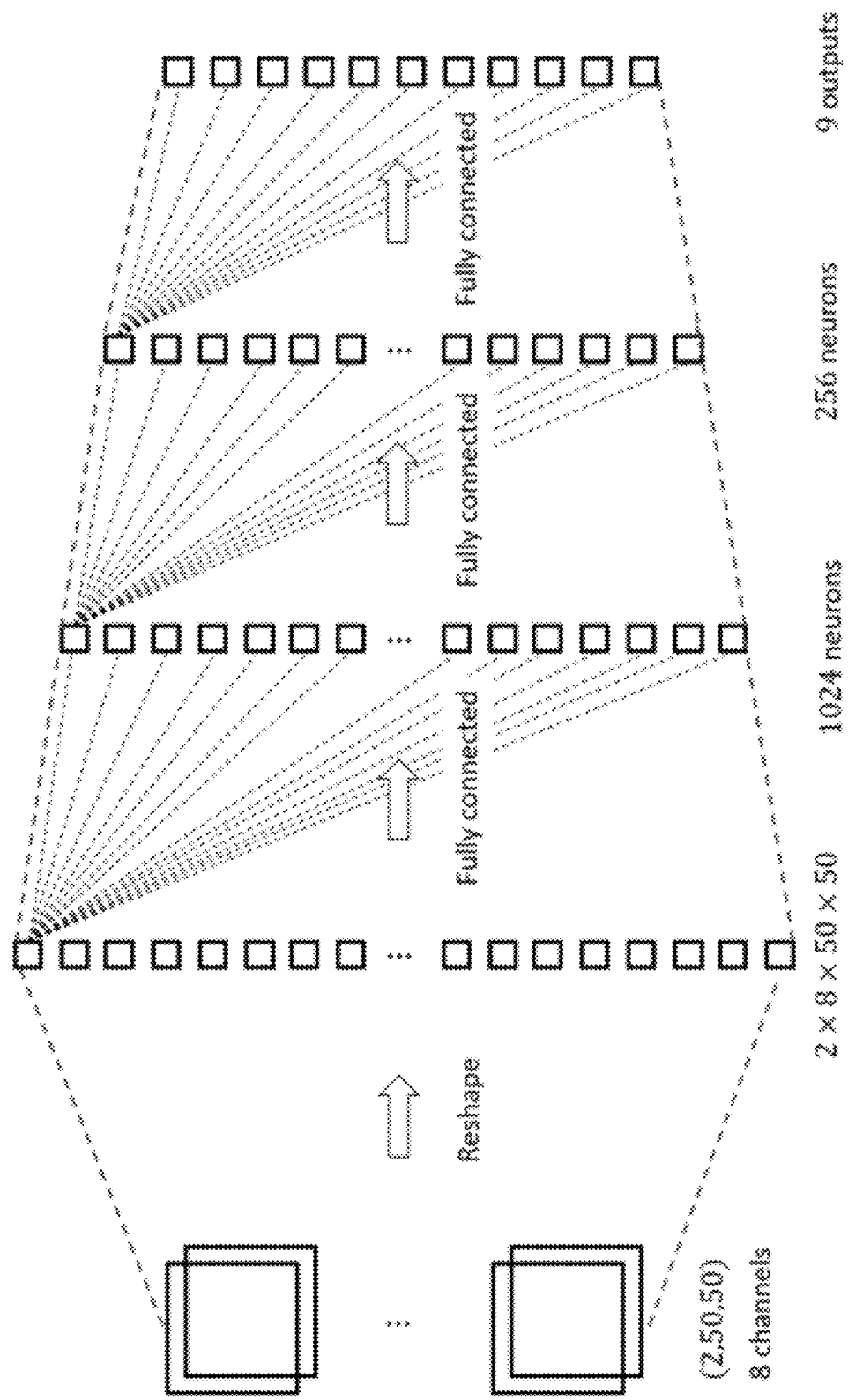
FIG. 10 shows one embodiment of the structure of the last two fully connected layers.

FIG. 10 shows one embodiment of the structure of the last two fully connected layers. Before connecting convolutional layer to a fully connected layer, the matrix is reshaped since the dimensions of the two matrixes do not match because the output of convolutional layer is four. After reshaping the matrix, there will be 2×8×50×50 neurons (neural nodes). In one embodiment, this number can be reduced, however this does entail some information loss.

The output a distribution indicates the probability that one particular action is a good action to take. The final determination of which action to take in one embodiment is generated by randomly choosing one among the available set of actions, based on the calculated distribution. That is, even if one action has a high probability of being a good one, it may not always be taken. This can help the exploration of other actions. By doing this, the system can avoid getting stuck at local maxima.

In one embodiment, rectified linear units are used as activation functions after each layer in convolutional neural network. The rectified linear units function returns 0 if it receives any negative input, but for any positive value x it returns that value back. So it can be written as $f(x)=\max(0, x)$. However, weights and biases must be carefully initialized when using rectified linear units. When the input is negative, it will have a 0 gradient, and the weights relating to this neuron do not get updated anymore. This is known as a dead neuron. When weights are randomly initialized, a significant number of dead neurons may be present after the first convolution. Therefore, instead of using rectified linear units, in one embodiment, hyperbolic tangent units are used as activation functions for each layer. Hyperbolic tangent units select for the center values.

In one embodiment, before inputting the matrix to the model, the input matrix is divided by the maximal value appearing in the state. This makes training faster by standardizing the inputs, and reduces the chances of getting stuck in local optima.

In one embodiment, the loss function, which is a measure of how good a prediction model does in terms of being able to predict the expected outcome, of the policy model is the cross entropy. It measures the dissimilarity between good actions and the predicted probabilities. As for the value model, L2 norm between actual reward and expected reward is applied to obtain the error.

Besides convolutional neural network, in one embodiment, the system can utilize recurrent neural network including LSTM (long short-term memory machine) to capture the time dependency across a series of routing states.

An asynchronous actor-critic agent (A3C) is a reinforcement learning method taking advantage of multithreads. Most EDA applications are multithreaded. For routing, the multithreads are partition based, as shown in FIG. 20. In one embodiment, A3C is utilized in the reinforcement learning system as well to take advantage of existing multithreaded capability.

Training the Model

After creating a new policy and value model, the weights and biases are initialized randomly, in one embodiment. That is, the output of the policy model will look like a uniform distribution. Before starting the training process, the system first trains the value model to a certain accuracy. In one embodiment, ten thousand data are collected for training the value model with two hundred data in each a batch. FIG. 11 shows an exemplary set of results of predictions after training. As can be seen, the actual reward of each step varies a lot (from −8 to 931).

The value model learns the average reward of each action, as the policy outputs a uniform distribution. Therefore, since the system does not know the variance of the reward it would be hard to evaluate whether the value model is accurate or not. The value of the loss function is not a good measurement initially. However, it is possible to judge the value model roughly by the trend of the output. For example, there is a big outlier, a bump of reward of 931. The exemplary value model predicts 790 at such state, while it only predicts 12 at the previous state. That is, based on the training, the value model can sense the differences between the states. Therefore, this value model is ready for the next stage of training.

In one embodiment, for training data, each step forms a data for training as the system uses immediate reward as a baseline. However, in one embodiment, the policy and value network are updated once per episode. In other words, a batch of data is collected after an episode, and subsequently used to train the model. There are two advantages to doing this: (1) saving time in collecting data. (2) as the model takes a batch of data, it takes a deeper look at the error surface, and it will be easier to find global optima.

Figure 12:
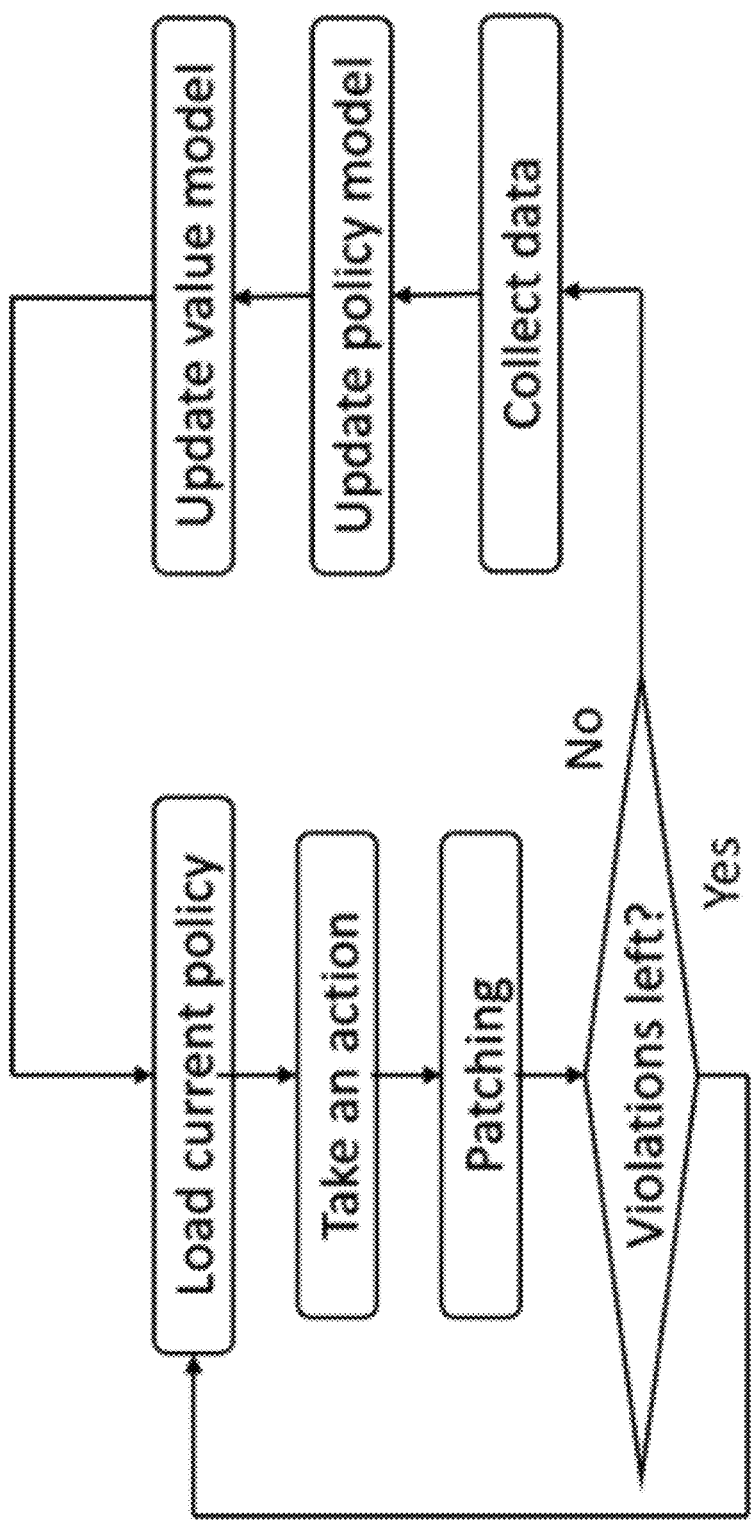
FIG. 12 is a flowchart of one embodiment of the overall flow of training the model and collecting data.

FIG. 12 shows one embodiment of the overall flow of training the model and collecting data.

Reinforcement learning is different from supervised learning, as there are not separate training data and testing data. In addition, as the problem size of this project is fairly large, there is issue about overfitting. Conventionally, drop out is adopted for regularization, which prevents the model from overfitting. In one embodiment, this system utilizes a slight drop out at each layer. In one embodiment, the keep rate=0.95. This gives a better chance for the model to find an optima. Note that the keep rate should not be low, as that may cause oscillation.

In one embodiment, as discussed above, immediate reward is used to calculate the advantage or value of each taken action. In other words, each state is independent from every other state, and can be used as a data point to train the model. In one embodiment, the transitions (i.e. the set of states and actions) in an episode are recorded and used for training after the episode is finished. In one embodiment, the transitions are packed as a batch to train the model. The average number of transitions in an episode at partition one is 200. By feeding more than one data set to the optimizer, it will have a more global sight to minimize the loss.

The result from training the model being run once with a large learning rate which determines how fast weights in the neural network change, is not as good as training the model to run multiple times with a small learning rate. For example, moving one big step on the error surface could make the result worse, however, taking several steps toward the gradient has a better chance to optimize the problem. Therefore, in one embodiment, the learning rate in this project is set fairly low, and the same data would be used to train the model multiple times. In addition, in one embodiment the rate can be tuned dynamically based on the magnitude of the loss. When the loss is large, a large learning rate is used. When the loss is small, a small learning rate is used.

Experimental Results

FIG. 13 illustrates a table which shows the results of running first test case at iteration 0. At iteration 0, all the partitions have the same size, so there is no issue about resolution. The first column indicates the number of the partition being patched. The second, third and fourth columns are the numbers of violations by applying heuristic method, random ordering and the prediction model described in the present application, respectively. Note that these DRC numbers are global DRC numbers among all partitions. By applying model prediction, the DRC number can be as small as the one by heuristic method, and even better sometimes.

FIG. 14 shows the results of the second test case. Note that in one embodiment the partition size is fixed no matter what the design is for the same library. Consequently, the second test case is much bigger than the first case. The model performs almost as well as the heuristic method.

To reduce the runtime overhead to less than 30%, the policy model may be simplified for a faster prediction. However, the value model can remain the same, as it is only involved in the training stage, causing no runtime overhead. In addition, the value model should be accurate enough to provide a useful baseline for the policy model to update.

The initial design described above utilized 8 layers, so the convolution was 3-dimensional. However, 3-dimensional convolutions on CPU are slow. On the other hand, 2-dimensional convolutions in TensorFlow are well-optimized. As a result, 2-dimensional convolutions are more desirable. By changing the convolution from 3-dimensional to 2-dimensional, the runtime overhead may be reduced. However, to do this, the filter is reshaped to 3-dimensional.

Figure 15:
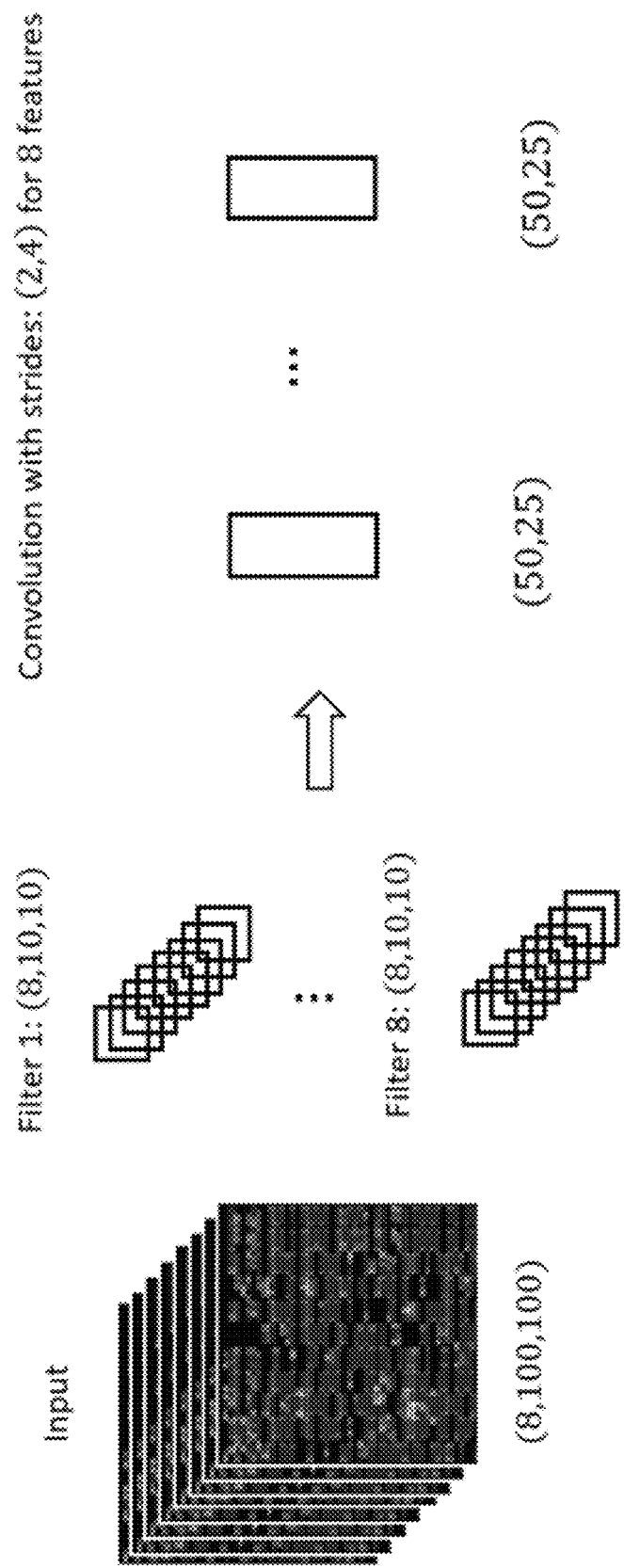
FIG. 15 shows one embodiment of a modified structure of 2-dimensional convolution at first layer.
Figure 16:
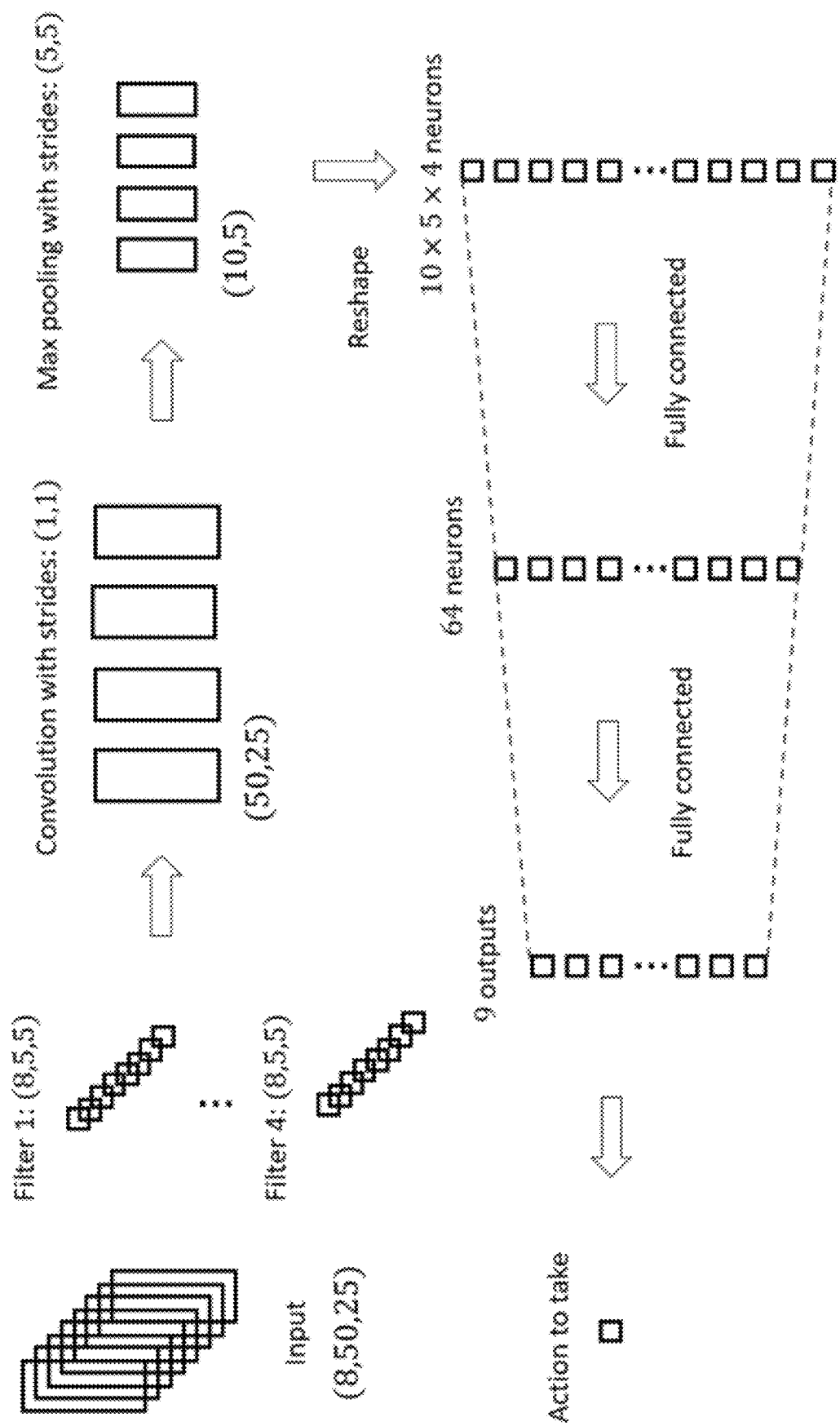
FIG. 16 shows one embodiment of the fully connected layers.

FIG. 15 shows one embodiment of a modified structure of 2-dimensional convolution at first layer. As the dimension of the input and the filter are the same, the filter only has to move along the x-y plane. By doing this, each layer of the input can be seen as a feature, and the filter has the corresponding weights for them to do the convolution. In addition, in one embodiment, the strides are defined as (2,4) for the filter. In other words, the filter moves 2 units horizontally (or 4 units vertically) after every calculation. Consequently, for this configuration the output would be (50,25) for each feature. FIG. 16 illustrates the rest of the structures of the network, moving to fully connected, and finally a single action to take, based on the analysis.

After this simplification of the model, the size of the weights and biases stored decreases from 966 megabytes to 123 megabytes, which significantly reduces the time for loading weights into the memory. In addition, the prediction time overhead drops as well, from 0.3 seconds to 0.009 seconds per prediction.

Obviously, the runtime overhead drops when the structure of the neural network is simplified. However, this must be done carefully, as the model could be too simple to solve the problem once it is simplified.

FIG. 17 shows the results of the performance for two test cases applying the 2-dimensional and 3-dimensional models respectively. The performance differences of the two model are not significant, but the speed differs significantly. Therefore, the 2-dimensional model which is much simpler than 3-dimensional one is preferable.

The value gradient model plays the most important role in the present system, as it provides a baseline for policy model. Consequently, it should be trained carefully to make sure the loss values stay within certain region.

As mentioned before, in one embodiment the value model is trained thousands of times before training the policy model, after initialization. Typically, one can stop training the value model once the loss of rewards is under 20,000. As noted above, the reward is based on a difference in the total number of design rule violations before and after the action. Recall that the loss function of the value model is L2 norm, and the average number of transitions is 200 per episode. Thus, a loss under 20,000 implies an average difference of 100 between the prediction and the real reward.

If the policy model starts training when the value model is not accurate, can cause problems. For example, if the value model predicts the rewards for the first three transitions as ($pr_1$=200, $pr_2$=15, $pr_3$=−3), while the real rewards are ($r_1$=1010, $r_2$=13, $r_3$=12) then, the advantage for each transition will be ($ad_1$=810, $ad_2$=−2, $ad_3$=15). As can be seen, the advantage of the first action is relatively high compared to the others. Consequently, the gradient will be much deeper along the axis which belongs to that action. That is, the optimizer will only try to increase the probability of that action, no matter what actions are taken in other states, as the advantage of one of the actions is too high. This will result in an incorrect output distribution for the policy model, and the distribution will remain consistent no matter what the state is. The system is designed to avoid this error by first training the value model to a reasonable level of accuracy.

Once the value model has a certain accuracy, the policy model can be trained. At this stage, the learning rate should not be too high to avoid oscillation. Specifically, in one embodiment, the value model is set to learn slower than the policy model. It is still possible that the policy model chooses a bad action at this stage, making the value model decrease the expected reward of such state. If the policy model is properly trained, the predictions made by value model will increase over training.

Figure 18:
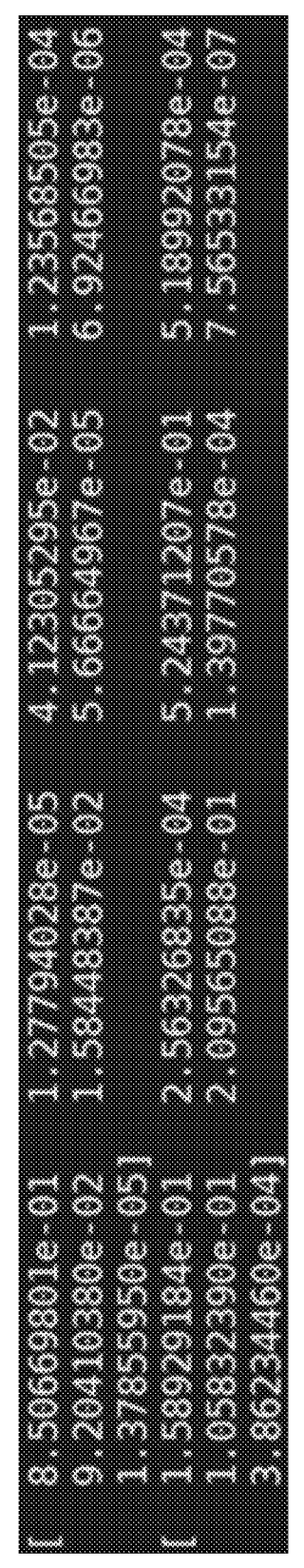

After many rounds of batch training, the policy model will have a great confidence on taking a specific action under given state. For example, the confidence level may be 85% to take action 1 at the current state and 52% to take action 3 at next state, as shown in FIG. 18. At this stage, the system may suffer from oscillation, which causes the value model not to converge because there is a chance to select bad actions and drop the baseline. Once the baseline decreases, there could be more than one action assumed to be "good".

In order to avoid oscillation and make the design converge faster, in one embodiment an additional procedure is added before updating the value model.

This additional procedure is as follows:

---
Procedure 1:
---
reward ← actual reward
calculated ← expected reward calculated by value model
if reward > calculated
   update_value ← reward
else
   update_value ← ( reward + calculated) / 2
end
update the model using update_value
---

In one embodiment, if the reward is higher than the calculated reward, the baseline is moved to that value. However, if a reward is lower than the calculated one, it may be the result of an unlucky choice, so the change in the baseline should be reduced. Therefore, in one embodiment, the system averages the value of the real reward and the calculated reward, and sets the result as the value for the value model to update. By doing this, the value model will give a better baseline for policy model to reference If the value model provides a reasonable baseline to update the policy model, the policy converges over time. This results in the policy model outputting a distribution which has one action with probability near 1. However, there can be some difficulties prevent the model from converging.

At the training stage, the value model provides the baseline which is the average reward under certain states. On average, four actions are assumed to be good, based on this baseline. Assuming the system encounters the same state twice, it is possible that different actions are chosen. Consequently, the policy model increases the probability of one action first, when it is chosen, and then increases the probability of the other action, when that is chosen. This may decrease the probability of the first action, causing the model to oscillate. In order to avoid such situations, in one embodiment, the policy model is updated frequently. In other words, the action which is assumed to be good is given a relatively large probability. This helps the value model to be stable first, and once the value model is stabilized, the policy model tends to converge.

However, this action might not be the best one. The probability for that first chosen action is set at greater than 50%, to reduce the risk of oscillation. In one embodiment, the probability is set between 50% and 80%, making it still possible to explore a better solution but strongly biasing the system toward choosing that first chosen action in a subsequent iteration. This can be done by adjusting the learning rate dynamically in one embodiment.

At the late stage, the probability of choosing an action under a certain state is large. However, the possibility to explore other good actions starts playing a role in causing oscillation. If a bad action is accidentally chosen, the baseline provided by the value model will decrease. Once the baseline decreases, more actions at that state will be assumed good. Therefore, the system is designed to enhance the probability that the action chosen has a high confidence of being a good one.

Procedure 2 shows one embodiment of a method to increase the probability that the action with the highest probability is selected. In one embodiment, the system chooses the action with the highest probability with a probability 0.5, and otherwise chooses an action based on calculated distribution, which will possibly choose the same action as well.

---
Procedure: 2 probability enhancement
---
probs ← probability distribution calculated by policy model
rand ← one random number between [0,1]
if rand > 0.5
   randomly choose one action to take based on probs
else
   choose the action with the largest probability in probs
end
---

Figure 19:
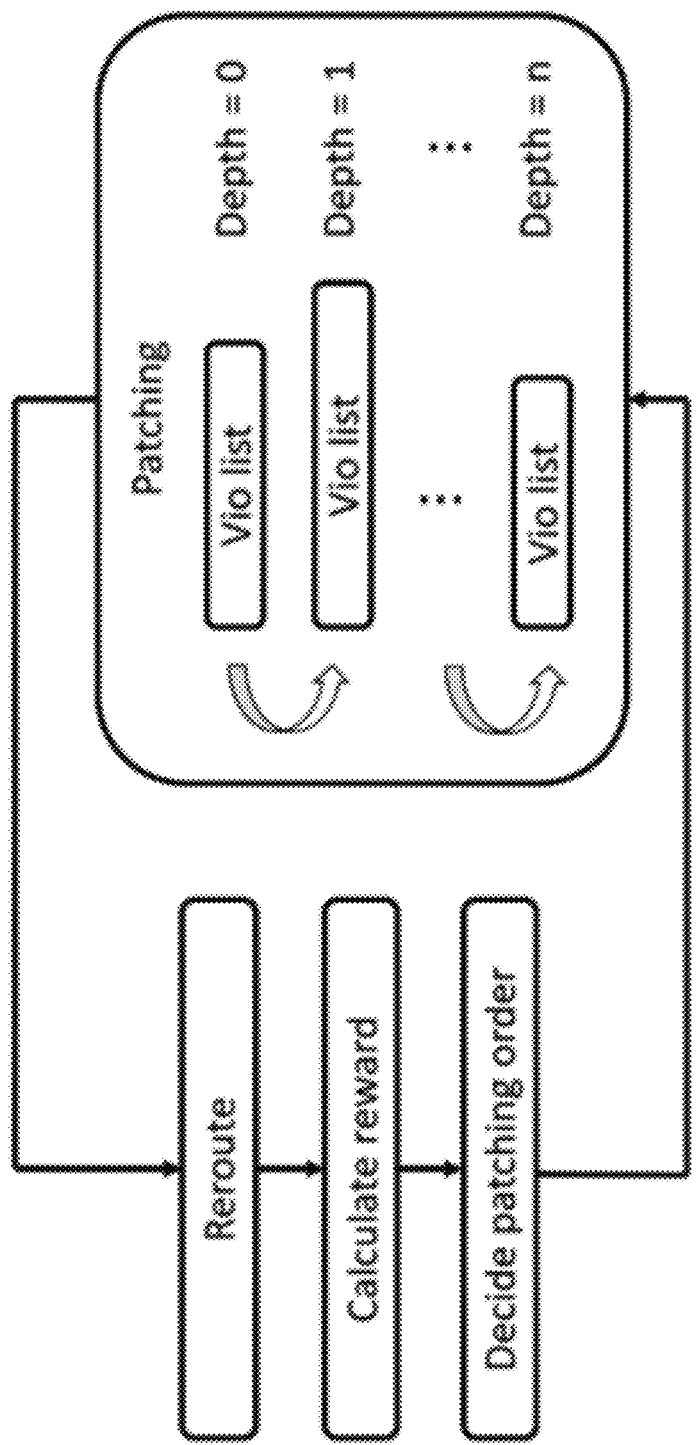
FIG. 19 is a flowchart of one embodiment of the order of operations.

In one embodiment, the system determines an order to patch when the depth is equal to zero, which is the beginning of the iteration. In one embodiment, rerouting is following up after the iteration is finished, and the reward is calculated after rerouting, as shown in FIG. 19. That is, the model learns not only the behavior of patching but also the effect of rerouting. In one embodiment, resolution can be increased by deciding the order at each depth when patching.

Figure 21:
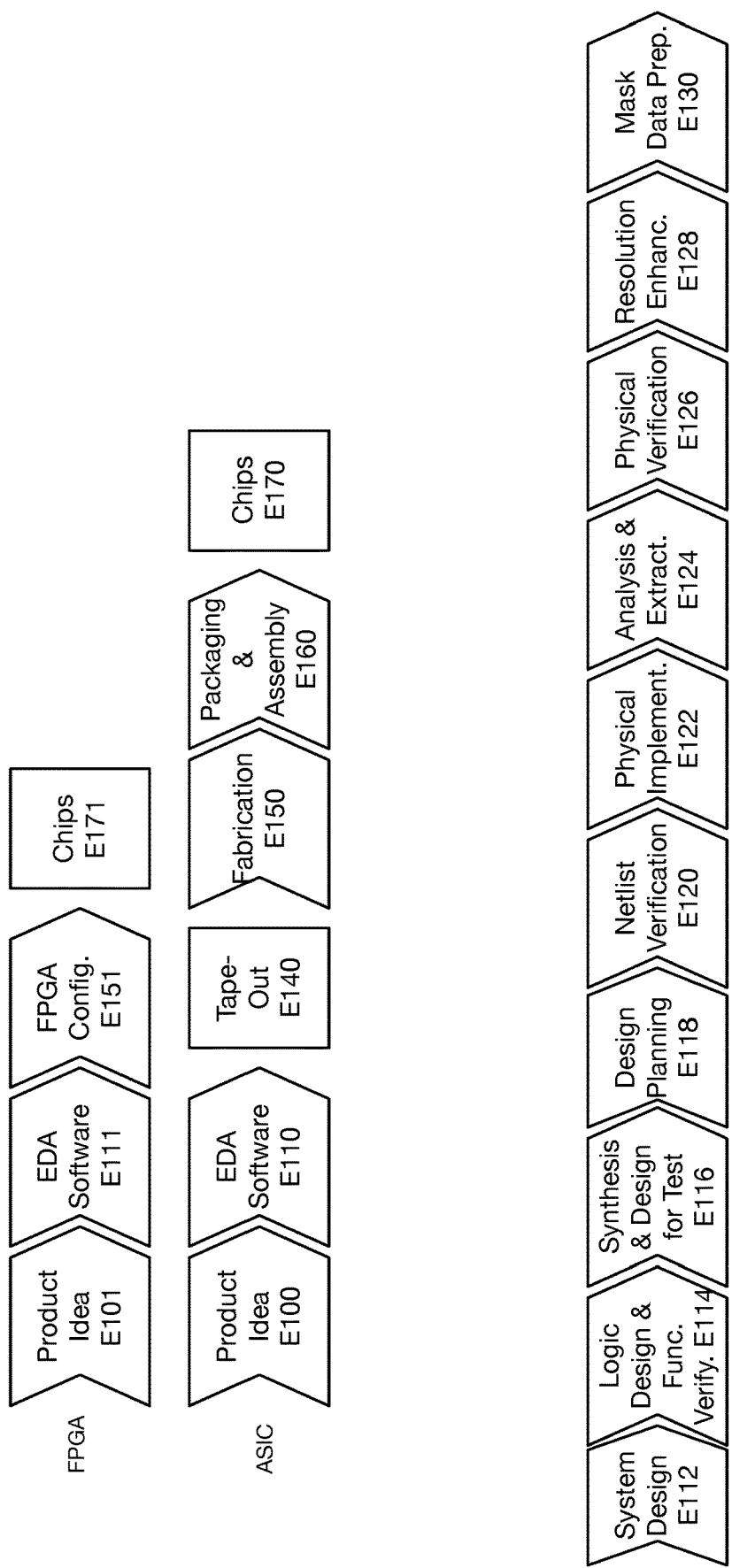
FIG. 21 is a diagram of one embodiment of electronic design automation (EDA) tools processes, in which the present system may be used.

FIG. 21 illustrates some EDA processes and software tools in which the present invention may be utilized. In one embodiment, the patch ordering system described is part of one or more electronic design automation (EDA) tools, which are used to design, calibrate, and adjust circuit designs, and circuit blocks. An EDA flow can include multiple processes, and each process can involve using one or more EDA software tools. These examples of EDA steps and software tools are for illustrative purposes only and are not intended to limit the embodiments to the forms disclosed.

To illustrate the EDA flow, consider an EDA system that receives one or more high level behavioral descriptions of an IC device (e.g., in HDL languages like VHDL, Verilog, etc.) and translates ("synthesizes") this high level design language description into netlists of various levels of abstraction. A netlist describes the IC design and is composed of nodes (functional elements) and edges, e.g., connections between nodes. At a higher level of abstraction, a generic netlist is typically produced based on technology independent primitives.

The generic netlist can be translated into a lower level technology-specific netlist based on a technology-specific (characterized) cell library that has gate-specific models for each cell (functional element). The models define performance parameters for the cells; e.g., parameters related to the operational behavior of the cells, such as power consumption, delay, transition time, and noise. The netlist and cell library are typically stored in computer readable media within the EDA system and are processed and verified using many well-known techniques.

Before proceeding further with the description, it may be helpful to place these processes in context. At a high level, for an application specific integrated circuit (ASIC), the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170). For a field programmable gate array (FPGA), the process starts with the product idea (step E101) and is realized in an EDA software design process (step E111). When the design is finalized, the FPGAs may be configured (event E151), applying the code to the FPGA circuits, resulting, ultimately, in finished chips (result E171).

The EDA software design process (step E110/E111) is actually composed of a number of steps E112-E130, shown in linear fashion for simplicity. In an actual design process, the particular design might have to go back through steps until certain tests are passed. Similarly, in any actual design process, these steps may occur in different orders and combinations. This description is therefore provided by way of context and general explanation rather than as a specific, or recommended, design flow for a particular circuit design.

A brief description of the components steps of the EDA software design process (step E110) will now be provided:

System design (step E112): The designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step E114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step E116): Here, the VHDL/Verilog is translated into a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Design planning (step E118): Here, an overall floorplan for the chip is constructed and analyzed for timing and top-level routing. Exemplary EDA software products from Synopsys, Inc. that can be used at this step include Jupiter and Floorplan Compiler products.

Netlist verification (step E120): At this step, the netlist is checked for compliance with timing constraints and for correspondence with the VHDL/Verilog source code. Exemplary EDA software products from Synopsys, Inc. that can be used at this step include VCS, VERA, Formality and PrimeTime products.

Physical implementation (step E122): The placement (positioning of circuit elements) and routing (connection of the same) occurs at this step. Exemplary EDA software products from Synopsys, Inc. that can be used at this step include the Astro product.

Analysis and extraction (step E124): At this step, the circuit function is verified at a transistor level, this in turn permits what-if refinement. Exemplary EDA software products from Synopsys, Inc. that can be used at this step include Star RC/XT, Raphael, and Aurora products. For FPGA design, in one embodiment the process ends here. Because FPGA programming is done through software, there are no physical configuration, resolution, and mask design issues.

For ASICS, next comes the Physical verification (step E126): At this step various checking functions are performed to ensure correctness for: manufacturing, electrical issues, lithographic issues, and circuitry. Exemplary EDA software products, Inc. that can be used at this step include the Hercules product.

Resolution enhancement (step E128): This step involves geometric manipulations of the layout to improve manufacturability of the design. Exemplary EDA software products from Synopsys, Inc. that can be used at this step include iN-Phase, Proteus, and AFGen products.

Mask data preparation (step E130): This step provides the "tape-out" data for production of masks for lithographic use to produce finished chips. Exemplary EDA software products from Synopsys, Inc. that can be used at this step include the CATS® family of products. The circuit blocks and systems may then be manufactured as an integrated circuit to provide the functionality designed, and built via an EDA system.

In one embodiment, the patch selection system may be implemented at the physical verification stage (E126). As noted above, during physical verification various checking functions are performed, including verification that the layout meets design rules (DRC). When a design rule is not met, the system applies patches to address these issues. The ordering of those patch applications takes place as part of the physical verification stage.

Figure 22:
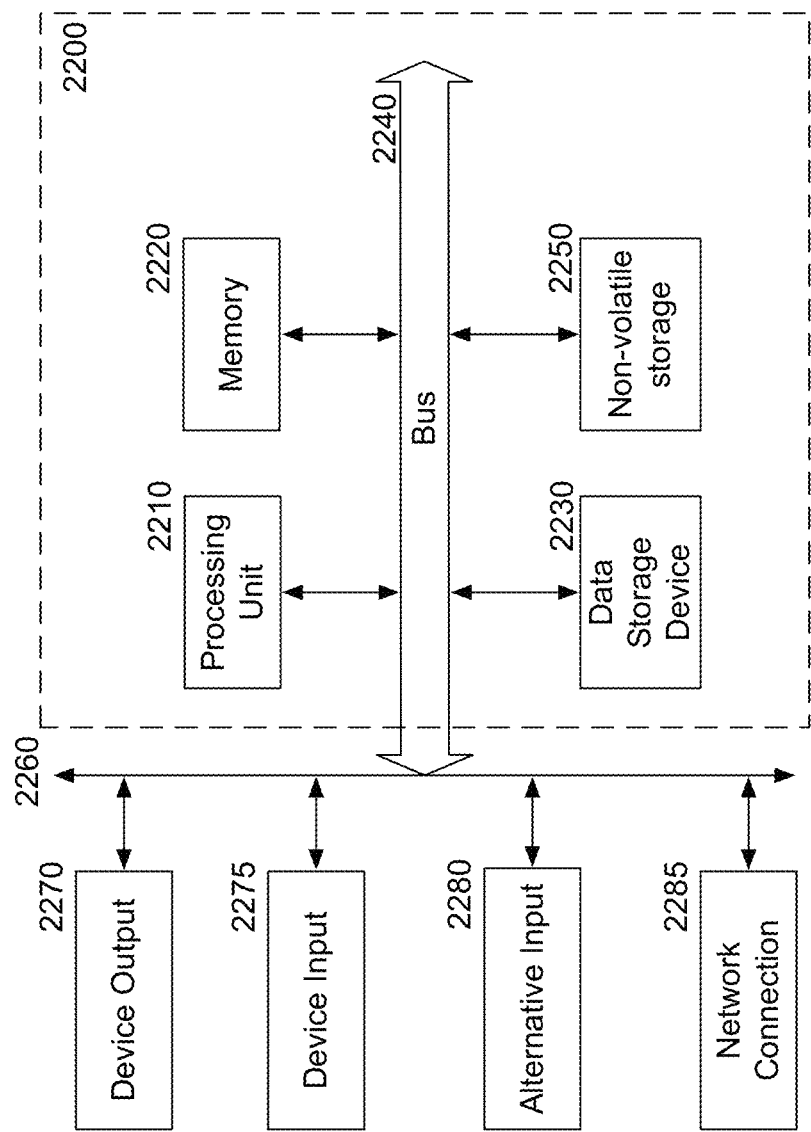
FIG. 22 is a block diagram of one embodiment of a computer system that may be used with the present system.

FIG. 22 is a block diagram of one embodiment of a computer system that may be used with the present invention. It will be apparent to those of ordinary skill in the art, however that other alternative systems of various system architectures may also be used.

The data processing system illustrated in FIG. 22 includes a bus or other internal communication means 2240 for communicating information, and a processing unit 2210 coupled to the bus 2240 for processing information. The processing unit 2210 may be a central processing unit (CPU), a digital signal processor (DSP), or another type of processing unit 2210.

The system further includes, in one embodiment, a random access memory (RAM) or other volatile storage device 2220 (referred to as memory), coupled to bus 2240 for storing information and instructions to be executed by processor 2210. Main memory 2220 may also be used for storing temporary variables or other intermediate information during execution of instructions by processing unit 2210.

The system also comprises in one embodiment a read only memory (ROM) 2250 and/or static storage device 2250 coupled to bus 2240 for storing static information and instructions for processor 2210. In one embodiment, the system also includes a data storage device 2230 such as a magnetic disk or optical disk and its corresponding disk drive, or Flash memory or other storage which is capable of storing data when no power is supplied to the system. Data storage device 2230 in one embodiment is coupled to bus 2240 for storing information and instructions.

The system may further be coupled to an output device 2270, such as a cathode ray tube (CRT) or a liquid crystal display (LCD) coupled to bus 2240 through bus 2260 for outputting information. The output device 2270 may be a visual output device, an audio output device, and/or tactile output device (e.g. vibrations, etc.)

An input device 2275 may be coupled to the bus 2260. The input device 2275 may be an alphanumeric input device, such as a keyboard including alphanumeric and other keys, for enabling a user to communicate information and command selections to processing unit 2210. An additional user input device 2280 may further be included. One such user input device 2280 is cursor control device 2280, such as a mouse, a trackball, stylus, cursor direction keys, or touch screen, may be coupled to bus 2240 through bus 2260 for communicating direction information and command selections to processing unit 2210, and for controlling movement on display device 2270.

Another device, which may optionally be coupled to computer system 2200, is a network device 2285 for accessing other nodes of a distributed system via a network. The communication device 2285 may include any of a number of commercially available networking peripheral devices such as those used for coupling to an Ethernet, token ring, Internet, or wide area network, personal area network, wireless network or other method of accessing other devices. The communication device 2285 may further be a null-modem connection, or any other mechanism that provides connectivity between the computer system 2200 and the outside world.

Note that any or all of the components of this system illustrated in FIG. 22 and associated hardware may be used in various embodiments of the present invention.

It will be appreciated by those of ordinary skill in the art that the particular machine that embodies the present invention may be configured in various ways according to the particular implementation. The control logic or software implementing the present invention can be stored in main memory 2220, mass storage device 2230, or other storage medium locally or remotely accessible to processor 2210.

It will be apparent to those of ordinary skill in the art that the system, method, and process described herein can be implemented as software stored in main memory 2220 or read only memory 2250 and executed by processor 2210. This control logic or software may also be resident on an article of manufacture comprising a computer readable medium having computer readable program code embodied therein and being readable by the mass storage device 2230 and for causing the processor 2210 to operate in accordance with the methods and teachings herein.

The present invention may also be embodied in a handheld or portable device containing a subset of the computer hardware components described above. For example, the handheld device may be configured to contain only the bus 2240, the processor 2210, and memory 2250 and/or 2220.

The handheld device may be configured to include a set of buttons or input signaling components with which a user may select from a set of available options. These could be considered input device #1 2275 or input device #2 2280. The handheld device may also be configured to include an output device 2270 such as a liquid crystal display (LCD) or display element matrix for displaying information to a user of the handheld device. Conventional methods may be used to implement such a handheld device. The implementation of the present invention for such a device would be apparent to one of ordinary skill in the art given the disclosure of the present invention as provided herein.

The present invention may also be embodied in a special purpose appliance including a subset of the computer hardware components described above, such as a kiosk or a vehicle. For example, the appliance may include a processing unit 2210, a data storage device 2230, a bus 2240, and memory 2220, and no input/output mechanisms, or only rudimentary communications mechanisms, such as a small touch-screen that permits the user to communicate in a basic manner with the device. In general, the more special-purpose the device is, the fewer of the elements need be present for the device to function. In some devices, communications with the user may be through a touch-based screen, or similar mechanism. In one embodiment, the device may not provide any direct input/output signals, but may be configured and accessed through a website or other network-based connection through network device 2285.

It will be appreciated by those of ordinary skill in the art that any configuration of the particular machine implemented as the computer system may be used according to the particular implementation. The control logic or software implementing the present invention can be stored on any machine-readable medium locally or remotely accessible to processor 2210. A machine-readable medium includes any mechanism for storing information in a form readable by a machine (e.g. a computer). For example, a machine readable medium includes read-only memory (ROM), random access memory (RAM), magnetic disk storage media, optical storage media, flash memory devices, or other storage media which may be used for temporary or permanent data storage. In one embodiment, the control logic may be implemented as transmittable data, such as electrical, optical, acoustical or other forms of propagated signals (e.g. carrier waves, infrared signals, digital signals, etc.).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

I claim:

1. A computer-implemented method of fixing design rule violations in an integrated circuit design system comprising:
   (a) receiving a portion of an integrated circuit design at a processor, including layout elements;
   (b) identifying a plurality of design rule violations in the integrated circuit design;
   (c) utilizing a deep learning algorithm to order the design rule violations and select an action, the selected action representing fixing of a particular design rule violation; and
   (d) taking the selected action to apply a first patch to fix the particular design rule violation, based on the order; and
   (e) returning to step (b) to select a next design rule violation to fix;
   wherein the integrated circuit design is used for manufacturing an integrated circuit.

2. The method of claim 1, wherein the deep learning algorithm comprises:
   a policy gradient model used to select the first action; and
   a value gradient model to provide a baseline for the policy gradient model.

3. The method of claim 2, further comprising:
   training the value gradient model prior to the training of the policy gradient model.

4. The method of claim 2, further comprising:
   selecting a region for optimizing;
   dividing the region into a number of cells per layer; and
   mapping each cell into a three-dimensional array, the three dimensions being layer, size in an X-dimension, and size in a Y dimension.

5. The method of claim 4, wherein a value of an element in the matrix is set to a number of shapes passing through the partition associated with the element.

6. The method of claim 2, wherein:
   the policy gradient model is a neutral network, with a state as an input and a probability of an action being a highest rated action in the state being an output; and the value gradient model is a neural network which takes the state as an input, and an expectation of total reward from this state under current policy as the output.

7. The method of claim 1, further comprising:
after applying the patch, re-routing the portion of the integrated circuit.

8. The method of claim 1, wherein a next state depends only on a current state.

9. The method of claim 1, wherein a reward is set for the action, the reward comprising a total reduction in the number of the design rule violations in the portion of the circuit design.

10. The method of claim 9, wherein determining the total reduction comprises:
identifying a number of violations removed by the application of the patch;
identifying a number of new violations created by the application of the patch; and
subtracting the number of new violations from the number of violations removed.

11. The method of claim 1, wherein a plurality of portions of the integrated circuit are evaluated in parallel.

12. An electronic design automation (EDA) system to design integrated circuits, the EDA system including a physical verification system to fix design rule violations in a layout of the integrated circuit, the physical verification system comprising:
the EDA system to receive a portion of an integrated circuit design, including layout elements;
the physical verification system to identify a plurality of design rule violations in the integrated circuit design;
a deep learning system to order the design rule violations and select an action, the selected action representing fixing of a particular design rule violation; and
the physical verification system to apply a first patch to the integrated circuit design, to fix the particular design rule violation, based on the order; and
the EDA system triggering the physical verification to select a next design rule violation to fix.

13. The EDA system of claim 12, wherein the deep learning system comprises:
a policy gradient model used to select the first action; and
a value gradient model to provide a baseline for the policy gradient model.

14. The EDA system of claim 13, further comprising:
the deep learning system including a training system to train the value gradient model prior to the training of the policy gradient model.

15. The EDA system of claim 13, wherein the physical verification system is further configured to select a region for optimizing, divide the region into a number of cells per layer, and map each cell into a three-dimensional array, the three dimensions being layer, size in an X-dimension, and size in a Y dimension.

16. The EDA system of claim 13, wherein the policy gradient model is a neutral network, with a state as an input and a probability of an action being a highest rated action in the state being an output.

17. The EDA system of claim 16, wherein the value gradient model is a neural network which takes the state as an input, and an expectation of total reward from this state under current policy as the output.

18. The EDA system of claim 12, wherein the deep learning system selects the action based on a highest reward, the highest reward comprising:
a number of new violations created by the application of the patch minus a number of violations removed by the application of the patch.

19. The EDA system of claim 12, wherein a plurality of portions of the integrated circuit are evaluated in parallel.

20. A computer-implemented method of fixing design rule violations in an integrated circuit design system comprising:
(a) receiving a portion of an integrated circuit design at a processor, including layout elements;
(b) identifying a plurality of design rule violations in the integrated circuit design;
(c) utilizing a deep learning algorithm to select an action, the selected action representing fixing of a particular design rule violation, the deep learning algorithm comprises a policy gradient model used to select the first action and a value gradient model to provide a baseline for the policy gradient model, wherein the deep learning algorithm identifies the action based on an action with a highest reward, wherein the reward comprises a total reduction in a number of design rule violations after fixing the design rule violation;
(d) taking the selected action to apply a first patch to fix the particular design rule violation; and
(e) returning to step (b) to select a next design rule violation to fix;
wherein the integrated circuit design is used for manufacturing an integrated circuit.

* * * * *